(12) United States Patent
Shinkawa et al.

(10) Patent No.: US 10,793,418 B2
(45) Date of Patent: Oct. 6, 2020

(54) ROTATING APPARATUS, OPTICAL SCANNING APPARATUS, AND IMAGE DISPLAY APPARATUS

(71) Applicants: Mizuki Shinkawa, Kanagawa (JP); Tsuyoshi Hashiguchi, Kanagawa (JP)

(72) Inventors: Mizuki Shinkawa, Kanagawa (JP); Tsuyoshi Hashiguchi, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 299 days.

(21) Appl. No.: 15/996,930

(22) Filed: Jun. 4, 2018

(65) Prior Publication Data

US 2018/0282147 A1     Oct. 4, 2018

Related U.S. Application Data

(63) Continuation of application No. PCT/JP2016/087644, filed on Dec. 16, 2016.

(30) Foreign Application Priority Data

Dec. 22, 2015     (JP) .................................. 2015-249828

(51) Int. Cl.
    *B81B 3/00*     (2006.01)
    *H01L 41/09*   (2006.01)
    (Continued)

(52) U.S. Cl.
    CPC ............. *B81B 3/0018* (2013.01); *B81B 3/00* (2013.01); *G02B 26/0858* (2013.01);
    (Continued)

(58) Field of Classification Search
    None
    See application file for complete search history.

(56) References Cited

U.S. PATENT DOCUMENTS

| 8,477,398 B2 | 7/2013 | Furukawa et al. |
| 2011/0122471 A1 | 5/2011 | Terada et al. |

(Continued)

FOREIGN PATENT DOCUMENTS

| JP | 2009-093120 | 4/2009 |
| JP | 2014-82464 | 5/2014 |

(Continued)

OTHER PUBLICATIONS

International Search Report dated Feb. 21, 2017 in PCT/JP2016/087644 filed on Dec. 16, 2016 (With English Translation).

(Continued)

*Primary Examiner* — Jennifer D. Carruth
(74) *Attorney, Agent, or Firm* — IPUSA, PLLC

(57) ABSTRACT

A rotating apparatus includes a folded back elastically deformable portion including a first piezoelectric element for deforming a first elastically deformable portion and a second piezoelectric element for deforming a second elastically deformable portion, and the rotating apparatus rotates a movable portion around a predetermined rotation axis, by respectively applying first and second driving voltage signals to the first and second piezoelectric elements, to deform the first and second elastically deformable portions. First and second connection positions have a relationship of being relatively the same or symmetrical across all folded back structures. The first connection position is where a signal line of the first driving voltage signal and the first piezoelectric element are connected, and the second connection position is where a signal line of the second driving voltage signal and the second piezoelectric element are connected.

10 Claims, 20 Drawing Sheets

(51) Int. Cl.
  *H02N 2/12* (2006.01)
  *H02N 2/14* (2006.01)
  *G02B 27/01* (2006.01)
  *G02B 26/10* (2006.01)
  *G02B 26/08* (2006.01)

(52) U.S. Cl.
  CPC ........... *G02B 26/10* (2013.01); *G02B 26/101* (2013.01); *G02B 27/01* (2013.01); *G02B 27/0101* (2013.01); *H01L 41/09* (2013.01); *H02N 2/12* (2013.01); *H02N 2/14* (2013.01)

(56) References Cited

U.S. PATENT DOCUMENTS

| | | | |
|---|---|---|---|
| 2013/0083378 A1* | 4/2013 | Tanaka | G02B 26/101 359/199.4 |
| 2014/0085694 A1 | 3/2014 | Aga et al. | |
| 2014/0368087 A1 | 12/2014 | Hiraoka et al. | |
| 2018/0172985 A1 | 6/2018 | Yoshida et al. | |
| 2018/0290881 A1 | 10/2018 | Yamada et al. | |

FOREIGN PATENT DOCUMENTS

| | | |
|---|---|---|
| JP | 2014-106343 | 6/2014 |
| JP | 5640974 | 12/2014 |
| JP | 5779472 | 9/2015 |
| JP | 2016-102812 | 6/2016 |
| JP | 2016-224211 | 12/2016 |
| JP | 2017-68205 | 4/2017 |
| WO | 2009/028152 | 3/2009 |
| WO | 2013/114857 | 8/2013 |

OTHER PUBLICATIONS

Office Action dated Dec. 11, 2018 issued with respect to the corresponding Japanese Patent Application No. 2017-558095 with partial English translation.

\* cited by examiner

ROTATING APPARATUS, OPTICAL SCANNING APPARATUS, AND IMAGE DISPLAY APPARATUS

The present application is a continuation application of International Application No. PCT/JP2016/087644 filed on Dec. 16, 2016, which claims priority to Japanese Patent Application No. 2015-249828, filed on Dec. 22, 2015. The contents of these applications are incorporated herein by reference in their entirety.

BACKGROUND OF THE INVENTION

1. Field of the Invention

The present invention relates to a rotating apparatus, an optical scanning apparatus, and an image display apparatus.

2. Description of the Related Art

In the related art, there is known a rotating apparatus, for example, that is used for an optical scanning apparatus that rotates an optical member such as a mirror for scanning light that is output from a light output unit.

For example, Patent Literature 1 discloses a light reflecting element (optical scanning apparatus) including a meander-shaped oscillator (a folded back elastically deformable portion) in which three or more diaphragms (a first elastically deformable portion or a second elastically deformable portion) are connected so as to be folded back at two or more turn portions. In this light reflecting element, two oscillators are arranged so as to sandwich a mirror portion (movable portion), and one end (terminal end) of each oscillator supports both sides of the mirror portion. In this light reflecting element, by applying a driving signal to the piezoelectric element of each diaphragm, the diaphragm of each oscillator, the diaphragm of each oscillator is curved and deformed, thereby rotating the mirror portion around a predetermined rotation axis.

Patent Literature 1: Japanese Patent No. 5640974

SUMMARY OF THE INVENTION

An aspect of the present invention provides a rotating apparatus, an optical scanning apparatus, and an image display apparatus, in which one or more of the disadvantages of the related art are reduced.

According to one aspect of the present invention, there is provided a rotating apparatus including a folded back elastically deformable portion including one or more first elastically deformable portions and one or more second elastically deformable portions, wherein a folded back structure is repeatedly formed one or more times, the folded back structure being formed by connecting a terminal end of a leading first elastically deformable portion of the one or more first elastically deformable portions to a starting end of a leading second elastically deformable portion of the one or more second elastically deformable portions at a leading folded back portion and connecting a terminal end of the leading second elastically deformable portion to a starting end of a next first elastically deformable portion of the one or more first elastically deformable portions at a next folded back portion; a supporting portion configured to support a starting end side of the folded back elastically deformable portion; a movable portion attached to a terminal end side of the folded back elastically deformable portion; a first piezoelectric element provided at the one or more first elastically deformable portions to deform the one or more first elastically deformable portions; a second piezoelectric element provided at the one or more second elastically deformable portions to deform the one or more second elastically deformable portions; a piezoelectric element driver configured to rotate the movable portion around a predetermined rotation axis, by respectively applying a first driving voltage and a second driving voltage that are different from each other to, the first piezoelectric element and the second piezoelectric element, to deform the one or more first elastically deformable portions and the one or more second elastically deformable portions; a first signal line configured to connect the first piezoelectric element to the piezoelectric element driver; and a second signal line configured to connect the second piezoelectric element to the piezoelectric element driver, wherein the first piezoelectric element includes a first voltage applying electrode, a first piezoelectric layer, and a common potential electrode, the second piezoelectric element includes a second voltage applying electrode, a second piezoelectric layer, and the common potential electrode, and a first connection position and a second connection position have a relationship of being relatively the same positions or a relationship of being symmetrical positions, the first connection position being a position where the first signal line and the first voltage applying electrode of the first piezoelectric element are connected in the first piezoelectric element, and the second connection position being a position where the second signal line and the second voltage applying electrode of the second piezoelectric element are connected in the second piezoelectric element.

DETAILED DESCRIPTION OF THE PREFERRED EMBODIMENTS

First Embodiment

In the following, a description is given of an embodiment (hereinafter, the present embodiment will be referred to as a "first embodiment"), in which a rotating apparatus according to the present invention is applied to an optical scanning apparatus of a head-up display (HUD) device that is an image display apparatus.

This is an example of a HUD device that is installed in an automobile that is a movable body; however, the present invention is not limited as such, and the present invention may be applied as an optical scanning apparatus of an image display apparatus installed in a movable body such as a vehicle, a ship, an aircraft, or a mobile robot, etc., or a non-movable body such as a work robot that operates a driving target such as a manipulator, etc., without moving from the position of the work robot.

Figure 1:
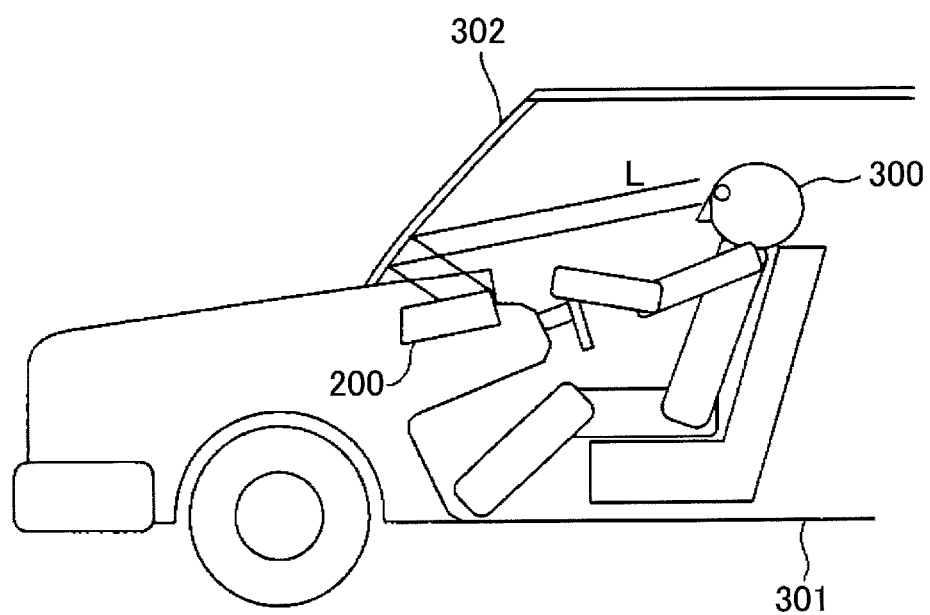
FIG. 1 is a schematic diagram schematically illustrating a configuration of an automobile equipped with an automotive HUD device according to a first embodiment of the present invention.

FIG. 1 is a schematic diagram schematically illustrating a configuration of an automobile equipped with an automotive HUD device according to the first embodiment.

Figure 2:
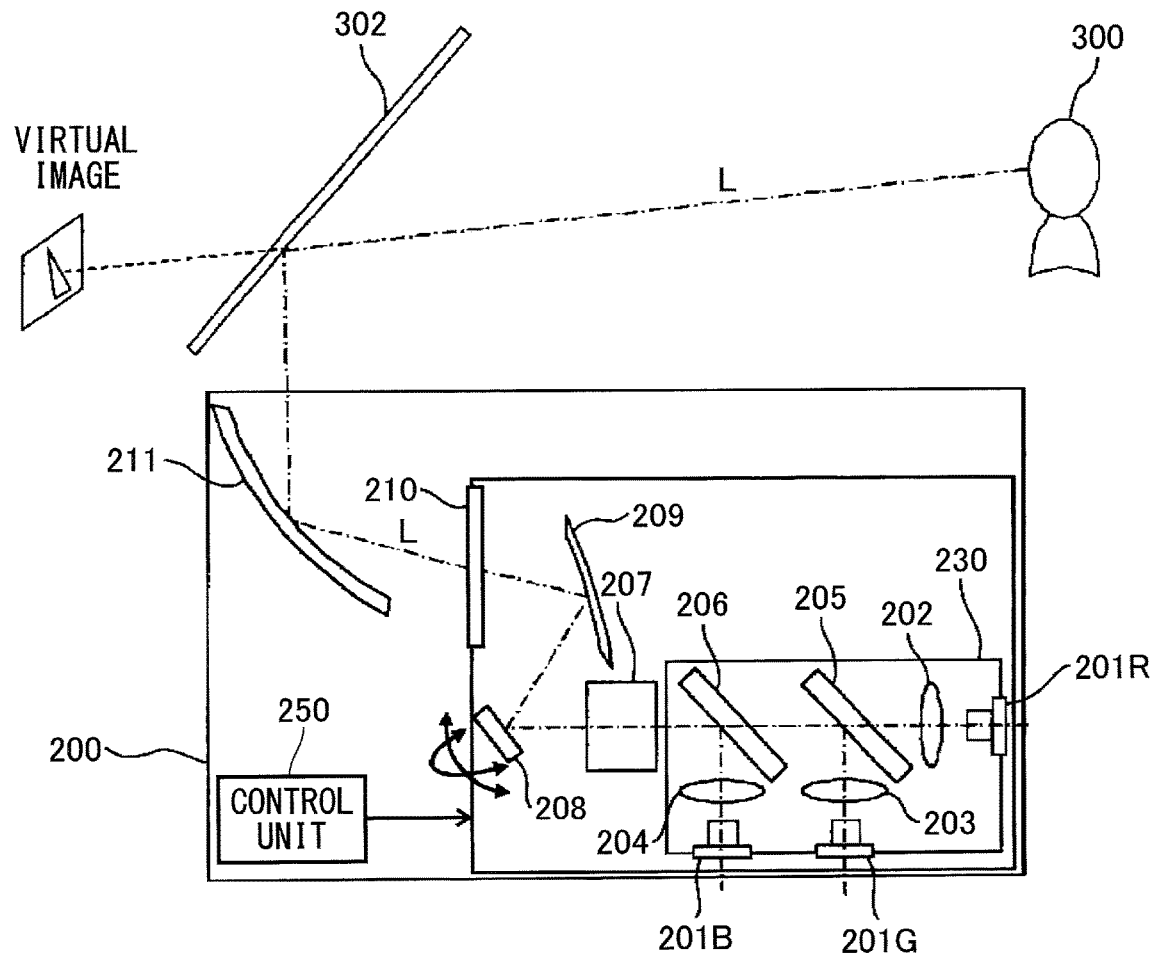
FIG. 2 is a schematic diagram schematically illustrating the internal configuration of the automotive HUD device according to the first embodiment of the present invention.

FIG. 2 is a schematic diagram schematically illustrating the internal configuration of the automotive HUD device according to the first embodiment.

Figure 3:
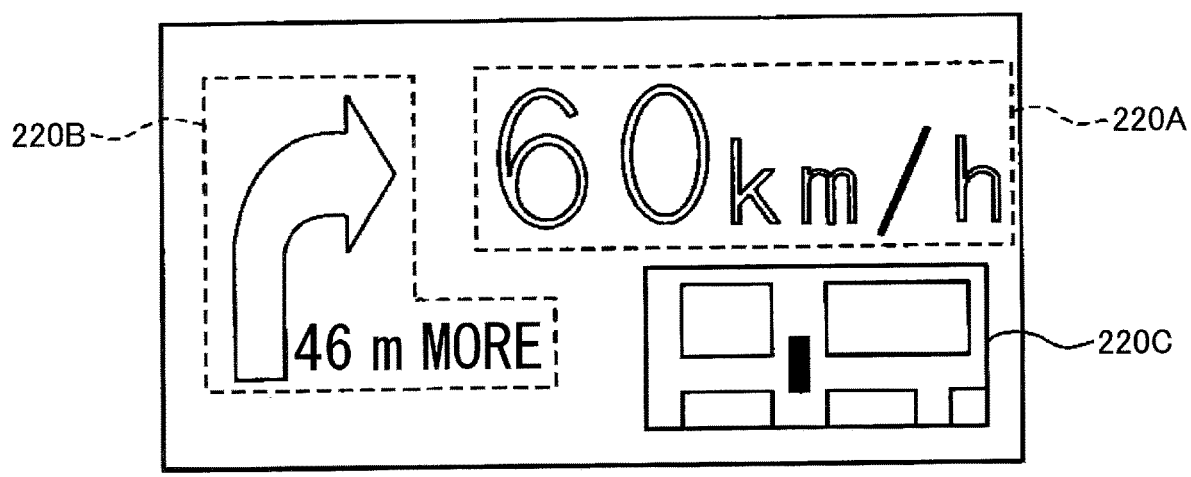
FIG. 3 is an explanatory diagram illustrating an example of an image displayed by the automotive HUD device according to the first embodiment of the present invention.

An automotive HUD device 200 according the first embodiment is installed in the dashboard of an automobile 301, for example. A projected light L, which is image light emitted from the automotive HUD device 200 in the dashboard, is reflected by a windshield 302, and heads toward an observer (a driver 300) that is the user. Accordingly, the driver 300 can view, for example, a navigation image as illustrated in FIG. 3, as a virtual image. Note that a combiner may be installed on the inner surface of the windshield 302, and the user may view the virtual image by a projection light reflected by the combiner.

In the navigation image illustrated in FIG. 3, the speed of the automobile 301 (an image of "60 km/h" in the illustrated example) is displayed in a first display area 220A. Furthermore, in a second display area 220B, a navigation image according to a car navigation device is displayed. In the illustrated example, a right turn instruction image indicating the direction in which the automobile 301 is to turn at the next turning point, and an image of "46 m more", indicating the distance to the next turning point, are displayed as a navigation image. Furthermore, in a third display area 220C, a map image (a map image around the subject automobile) according to the car navigation device is displayed.

The automotive HUD device 200 includes red, green, and blue laser light sources 201R, 201G, and 201B, collimator lenses 202, 203, and 204 provided for the respective laser light sources, two dichroic mirrors 205 and 206, a light quantity adjusting unit 207, an optical scanning apparatus 208, a free curved surface mirror 209, a screen 210, a projection mirror 211, and a control unit 250. Furthermore, in a light source unit 230 as a light output unit according to the first embodiment, the laser light sources 201R, 201G, and 201B, the collimator lenses 202, 203, and 204, and the dichroic mirrors 205 and 206 are unitized by an optical housing.

The automotive HUD device 200 according to the first embodiment projects an intermediate image, which is displayed on the screen 210, onto the windshield 302 of the automobile 301, so that the driver 300 can view the intermediate image as a virtual image. The color laser beams emitted from the laser light sources 201R, 201G, and 201B are turned into substantially collimated light by the collimator lenses 202, 203, and 204, respectively, and are combined by the two dichroic mirrors 205 and 206. The light amount of the combined laser beam is adjusted by the light quantity adjusting unit 207 and then the combined laser beam is two-dimensionally scanned by the optical scanning apparatus 208. The projected light L, which has been two-dimensionally scanned by the optical scanning apparatus 208, is corrected for distortion by being reflected from the free curved surface mirror 209, and is then condensed on the screen 210 to display an intermediate image. The screen 210 is formed of a microlens array in which microlenses are two-dimensionally arranged, and the screen 210 enlarges the projection light L incident on the screen 210 in units of microlenses.

The optical scanning apparatus 208 is controlled by the control unit 250 to cause the mirror to reciprocally rotate in the main scanning direction and the sub scanning direction with an actuator driving device to be described later, to two-dimensionally scan (raster scan) the projection light L incident on the mirror. The drive control by this actuator driving device is performed by the control unit 250 in synchronization with the light emission timings of the laser light sources 201R, 201G, and 201B.

In the first embodiment, an illuminometer, which is for measuring the brightness around the virtual image displayed by the automotive HUD device 200, is arranged on a dashboard, etc. In accordance with the measurement result of the illuminometer, the control unit controls the light quantity adjusting unit 207. Specifically, as the surroundings of the virtual image become brighter, the amount of projection light transmitted through the light quantity adjusting unit 207 is controlled so as to increase, and as the surroundings of the virtual image become darker, the amount of projected light transmitted through the light quantity adjusting unit 207 is controlled so as to decrease. By performing such light amount adjustment control, the visibility of the image can be secured by displaying an image with high brightness even if the surroundings of the virtual image (in front of the subject automobile) are bright. Furthermore, when the surroundings of the virtual image (in front of the subject automobile) are dark, if the brightness of the image is high, the image will appear to be glaring and the visibility in front of the subject automobile is degraded. However, by performing the light quantity adjustment control as described above, when the surroundings of the virtual image (in front of the subject automobile) are dark, the visibility in front of the subject automobile can also be secured.

Next, the configuration and operations of the actuator driving device forming the optical scanning apparatus 208 will be described.

Figure 4:
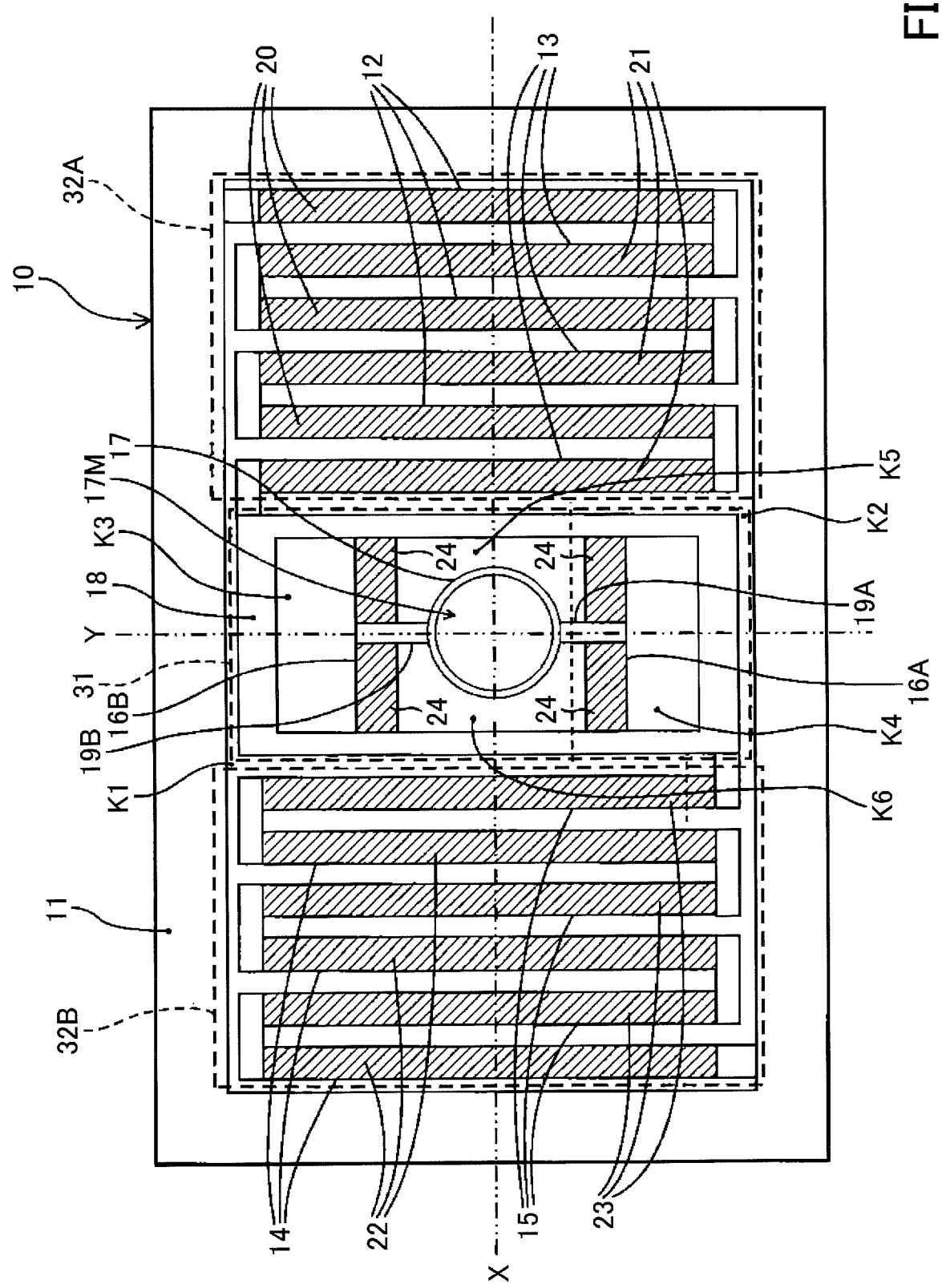
FIG. 4 is a plan view illustrating a frame substrate of the actuator driving device according to the first embodiment of the present invention.

FIG. 4 is a plan view illustrating a frame substrate 10 of the actuator driving device according to the first embodiment.

The actuator driving device according to the first embodiment is a Micro-Electro-Mechanical Systems (MEMS) scanner that scans light in two directions of the X direction (corresponding to the main scanning direction) and the Y direction (corresponding to the sub scanning direction). The frame substrate 10 according to the first embodiment includes a support frame 11 as a support portion positioned on the outer periphery, elastically deformable portions 12 to 15, 16A, and 16B formed by a plurality of notches K1 to K6 in the support frame 11, a movable portion frame 18, torsion bars 19A and 19B, and a movable portion 17. The actuator driving device according to the first embodiment can be largely divided into a main scanning driving unit 31 as a first movable portion rotating unit that rotates the movable portion 17 in the main scanning direction, and sub-scanning driving units 32A and 32B as a second movable portion rotating unit that rotates the movable portion 17 in the sub-scanning direction.

In the first sub-scanning driving unit 32A, one end (starting end) of each of the first elastically deformable portions 12 is fixed to the support frame 11, and the other end of each of the first elastically deformable portions 12 is fixed to the rear portion of each of the second elastically deformable portions 13. The first elastically deformable portions 12 and the second elastically deformable portions 13 form structures that are folded back three times (meandering structure) by the notches K1, K2, and K7. Then, the upper right corner portion of the movable portion frame 18 in the figure is fixed to the leading end portion (terminal end) of the second elastically deformable portion 13 of the last folded back structure.

Similarly, in the second sub-scanning driving unit 32B, the other end (starting end) of each of the third elastically deformable portions 14 (the first elastically deformable portion in the sub-scanning driving unit 32B) is fixed to the support frame 11, and one end of the third elastically deformable portions 14 is fixed to the rear portion of each of the fourth elastically deformable portions (the second elastically deformable portion in the second sub-scanning driving unit 32B). The third elastically deformable portions 14 and the fourth elastically deformable portions 15 form structures that are folded back three times by the notches K1, K2, and K8. Then, the lower left corner portion of the movable portion frame 18 in the figure is fixed to the leading end portion (terminal end) of the fourth elastically deformable portion 15 of the last folded structure.

Furthermore, in the main scanning driving unit 31, the notches K3 to K6 are formed inside the movable portion frame 18, and two fifth elastically deformable portions 16A and 16B extending in the left/right direction in the figure are formed so as to connect the left and right frame portions of the movable portion frame 18 in the figure. Furthermore, one end of each of the torsion bars 19A and 19B is fixed to the center portion in the left/right direction in the figure of the two fifth elastically deformable portions 16A and 16B, respectively, and the upper and lower ends in the figure of the movable portion 17 are respectively held by the other end of each of the torsion bars 19A and 19B. A mirror 17M as an optical member is formed on the surface of the movable portion 17.

Sub-scanning piezoelectric elements 20 to 23, which serve as driving means for applying a driving force for elastically deforming the elastically deformable portions 12 to 15, are attached to the surfaces of the elastically deformable portions 12 to 15. Furthermore, a main scanning piezoelectric element 24, which serves as a second driving means for applying a driving force for elastically deforming the fifth elastically deformable portions 16A and 16B, is attached to the surfaces of the fifth elastically deformable portions 16A and 16B.

Due to the elastic deformation of the elastically deformable portions 12 to 15 in the sub-scanning driving units 32A and 32B, the movable portion frame 18, the fifth elastically deformable portions 16A and 16B inside the movable portion frame 18, the torsion bars 19A and 19B, and the movable portion 17 are reciprocally rotated in an integral manner, by receiving a rotation torque around a rotation axis parallel to the X direction (the X direction axis passing through the substantially center point of the mirror 17M on the movable portion 17). That is, the sub-scanning driving units 32A and 32B rotate the entire main scanning driving unit 31 around the X axis, thereby implementing a rotation motion of the movable portion 17 in the sub-scanning direction.

Figure 5:
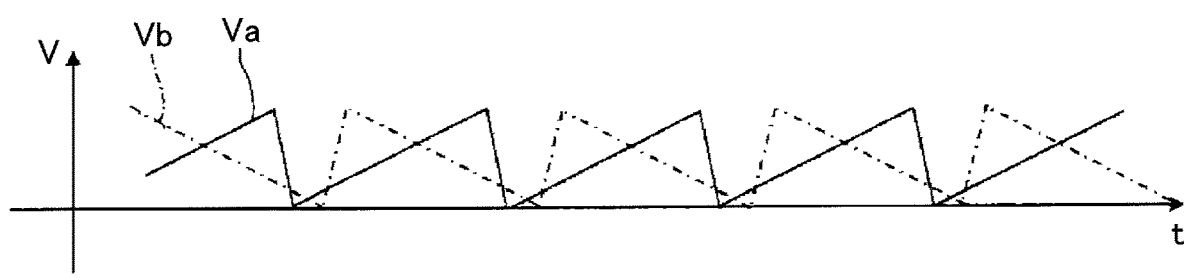
FIG. 5 is a waveform diagram illustrating a sub-scanning drive signal applied to a sub-scanning piezoelectric element on the frame substrate according to the first embodiment of the present invention.

Specifically, a first sub-scanning driving signal indicated by reference character Va in FIG. 5 is applied to the first sub-scanning piezoelectric element 20 that is the first piezoelectric element in the first sub-scanning driving unit 32A and the fourth sub-scanning piezoelectric element 23 that is the second piezoelectric element in the second sub-scanning driving unit 32B. On the other hand, a second sub-scanning driving signal indicated by symbol Vb in FIG. 5 is applied to the second sub-scanning piezoelectric element 21 that is the second piezoelectric element in the first sub-scanning driving unit 32A and the third sub-scanning piezoelectric element 22 that is the first piezoelectric element in the second sub-scanning driving unit 32B. When such sub-scanning driving signals Va and Vb are applied, each of the sub-scanning piezoelectric elements 20 to 23 expands and contracts according to the voltage value, so that each of the elastically deformable portions 12 to 15 is warped so as to be curved and deformed by this expansion and contraction. More specifically, for example, the upper end side of the movable portion frame 18 in the figure is displaced toward the back side as viewed in the figure with respect to the support frame 11, whereas the lower end side of the movable portion frame 18 in the figure is displaced toward the front side as viewed in the figure. Due to such displacement, the inclination angle of the movable portion 17 in the movable portion frame 18 changes with respect to the support frame 11, and the mirror 17M on the movable portion 17 reciprocally rotates around the X direction axis passing through the substantially center point of the mirror 17M.

The frequency of the driving signal for the sub-scanning direction according to the first embodiment is set to approximately several tens Hz, for example. When the frequency is used for optical scanning in the image vertical direction of the image display apparatus for displaying a general image or a video, the frequency is set to approximately 60 Hz to 70 Hz. Furthermore, the sub-scanning driving signal according to the first embodiment is a saw tooth wave driving signal; however, the sub-scanning driving signal is not limited as such.

On the other hand, the main scanning driving unit 31 implements a reciprocating rotation motion around the Y direction axis (main scanning direction) of the mirror 17M on the movable portion 17. In the main scanning driving unit 31, the movable portion 17 is rotated by receiving a rotation torque around a rotation axis parallel to the Y direction (Y direction axis passing through the substantially center point of the mirror 17M on the movable portion 17) by the elastic deformation of the fifth elastically deformable portions 16A and 16B. In the first embodiment, a raster scanning operation is performed in which the rotation motion in the main scanning direction is performed a plurality of times (for example, 525 times), with respect to one rotation motion in the sub-scanning direction described above. For this reason, it is desirable to implement a large rotation motion with as little energy as possible, for the rotation motion in the main scanning direction. Therefore, in the first embodiment, the driving signal for the main scanning direction is set to a resonance frequency that can resonate with the elastic deformation of the fifth elastically deformable portions 16A and 16B.

When the main scanning driving signal is applied, the main scanning piezoelectric element 24 expands and contracts according to the voltage value, and each of the fifth elastically deformable portions 16A and 16B is warped so as to be curved and deformed by this expansion and contraction. Accordingly, the torsion bars 19A and 19B fixed to the fifth elastically deformable portions 16A and 16B are twisted in the longitudinal direction, the inclination angle of the movable portion 17 with respect to the support frame 11 changes, and the mirror 17M on the movable portion 17 reciprocally rotates around the Y direction axis (main scanning direction).

In the first embodiment, the rotation motion is performed by using the resonance with respect to the main scanning direction, and therefore it is easy to stably perform a large rotation motion; however, in this case, with respect to the sub-scanning direction, it is difficult to perform a rotation motion by using the resonance. Therefore, in the first embodiment, a non-resonant rotation motion is performed in the sub-scanning direction. In the non-resonant rotation motion, the elastic deformation amount that can be achieved by a single sub-scanning piezoelectric element is small, and therefore in the first embodiment, as described above, three folded back structures are provided in the elastically deformable portions 12 to 15, and two sets of piezoelectric element groups of the first and fourth sub-scanning piezoelectric elements 20 and 23 and the second and third sub-scanning piezoelectric elements 21 and 22, are operated in parallel, whereby a large operation motion of the movable portion 17 is achieved.

Moreover, in the first embodiment, the folded back structures (meandering structure) of the two sub-scanning driving units 32A and 32B that are arranged so as to sandwich the movable portion 17, are point symmetrical with respect to the movable portion 17. Therefore, the terminal ends of the elastically deformable portions 12 to 15 of the sub-scanning driving units 32A and 32B respectively support the opposite end portions in the Y direction (the upper end in the figure and the lower end in the figure) of the movable portion frame 18. Then, in the first embodiment, as described above, the sub-scanning driving signals Va and Vb are applied to the sub-scanning piezoelectric elements 20 to 23 of the sub-scanning driving units 32A and 32B, respectively, such that the upper end side of the movable portion frame 18 in the figure with respect to the support frame 11 is displaced to the back side in the figure, and the lower end side in the figure is displaced to the front side in the figure. Due to such a configuration, a larger rotation motion of the movable portion 17 can be achieved, than a configuration in which the folded back structures (meandering structure) of the two sub-scanning driving units 32A and 32B arranged so as to sandwich the movable portion 17 are line symmetrical with respect to the Y direction axis passing through the movable portion 17.

In the first embodiment, the sub-scanning piezoelectric elements 20 to 23 are formed on only one surface of the frame substrate 10. Furthermore, the frame substrate 10 according to the first embodiment, which will be described in detail later, is made from a silicon substrate obtained by processing a silicon wafer (Si). Furthermore, the main scanning piezoelectric element 24, the sub-scanning piezoelectric elements 20 to 23, and the electrodes thereof can be formed in accordance with a semiconductor process, and cost reduction by mass production can be easily achieved. In particular, in the first embodiment, the elastically deformable portions 12 to 15, 16A, and 16B to which the piezoelectric elements 20 to 24 are attached and the movable portion frame 18 are made of a single structure formed by a single member referred to as the frame substrate 10 that is the same substrate. Moreover, the piezoelectric elements 20 to 24 are used as driving means for applying a driving force or a displacing force for partially displacing (curving and deforming) the elastically deformable portions 12 to 15, 16A, and 16B. Therefore, it is possible to collectively form the wirings of the piezoelectric elements 20 to 24 and the signal lines thereof, and the manufacturing process can be simplified. As each of the piezoelectric elements 20 to 24, lead zirconate titanate (PZT) is used; however, other piezoelectric element materials may be used.

Here, in the first embodiment, in the first sub-scanning driving unit 32A, a first driving voltage signal line is connected to the first sub-scanning piezoelectric element 20 provided in the first elastically deformable portion 12, and a first sub-scanning driving signal Va, as a first driving voltage signal, is applied from the first driving voltage signal line. Similarly, a second driving voltage signal line is connected to the second sub-scanning piezoelectric element 21 provided in the elastically deformable portion 13, and a second sub-scanning driving signal Vb, as a second driving voltage signal, is applied from the second driving voltage signal line. As described above, when different driving voltage signals Va and Vb are respectively applied to different portions of the elastically deformable portions forming the folded back structures, namely the first elastically deformable portions 12 and the second elastically deformable portions 13, to curve and deform each of these portions, the curved and deformed state tends to be non-uniform between the first elastically deformable portion 12 and the second elastically deformable portion 13. Therefore, even if the shape of the first elastically deformable portion 12 and the shape of the second elastically deformable portion 13 are made to be identical with high precision, or if the shape of the first sub-scanning piezoelectric element 20 and the shape of the second sub-scanning piezoelectric element 21 provided thereon are made to be identical with high precision, it is difficult to rotate the movable portion 17 by a desired rotation motion.

The inventors of the present invention found that one of the factors of the non-uniformness of the curved and deformed state between the first elastically deformable portion 12 and the second elastically deformable portion 13 is that the relationship of the connection positions of the signal lines between the first sub-scanning piezoelectric element 20 and the second sub-scanning piezoelectric element 21 is not a relationship that the positions are relatively the same or a relationship that the positions are symmetrical. This will be described in detail below. Note that although the sub-scanning driving unit 32A will be described here, the same applies to the sub-scanning driving unit 32B.

Figure 6:
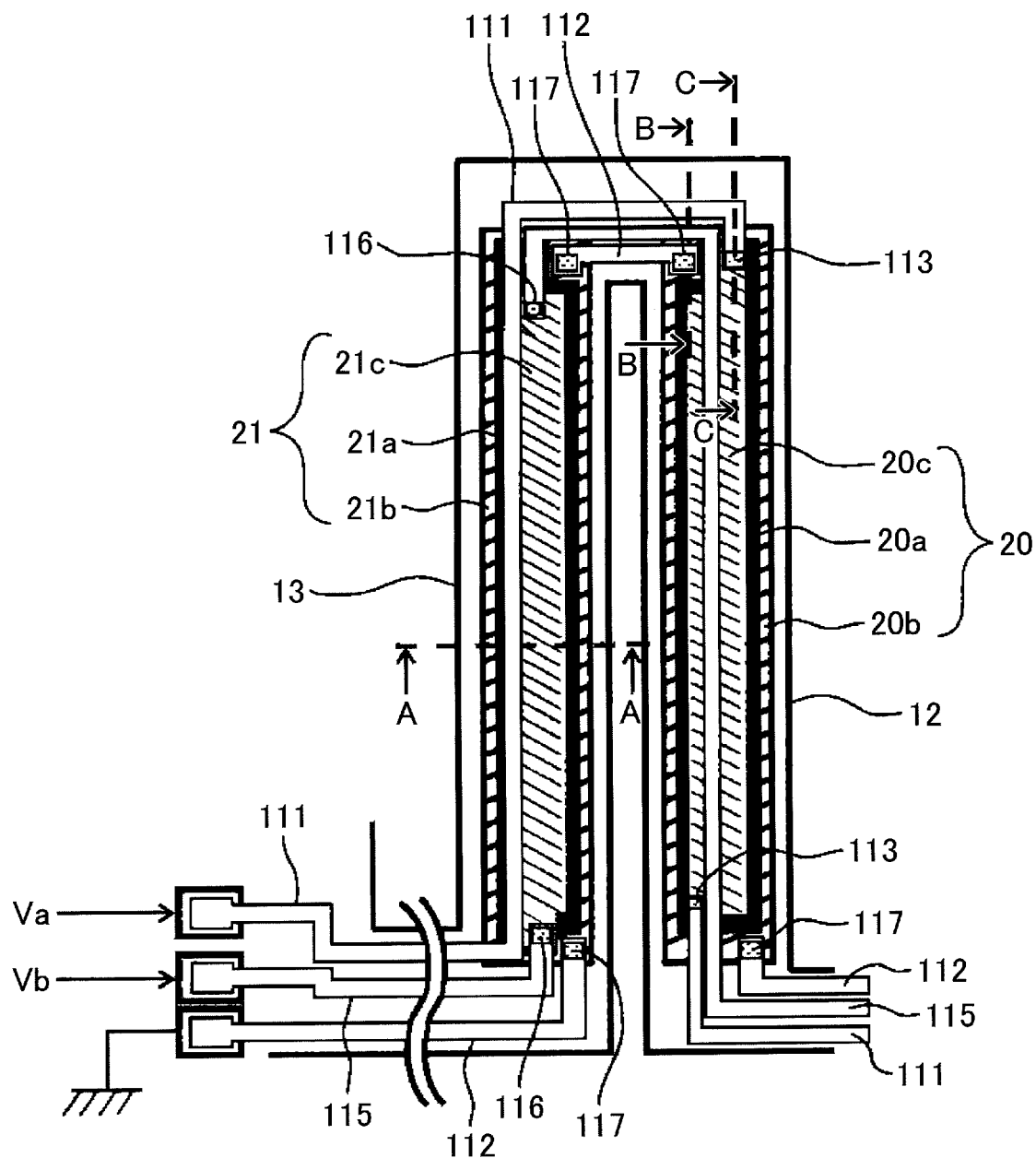
FIG. 6 is an explanatory diagram illustrating an example of the wiring of signal lines in a first elastically deformable portion, a second elastically deformable portion, and folded back portions thereof in a first sub-scanning driving unit of the related art.

FIG. 6 is an explanatory diagram illustrating an example of the wiring of signal lines in the first elastically deformable portion 12, the second elastically deformable portion 13, and a folded back portion thereof in the first sub-scanning driving unit 32A of the related art.

Figure 7:
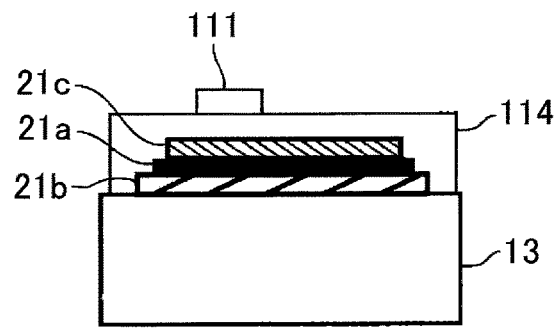
FIG. 7 is a cross-sectional view taken along a line A-A in FIG. 6 of the related art.

FIG. 7 is a cross-sectional view taken along a line A-A in FIG. 6.

Figure 8:
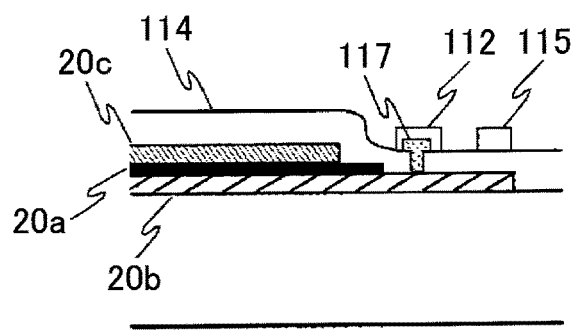
FIG. 8 is a sectional view taken along a line B-B in FIG. 6 of the related art.

FIG. 8 is a sectional view taken along a line B-B in FIG. 6.

Figure 9:
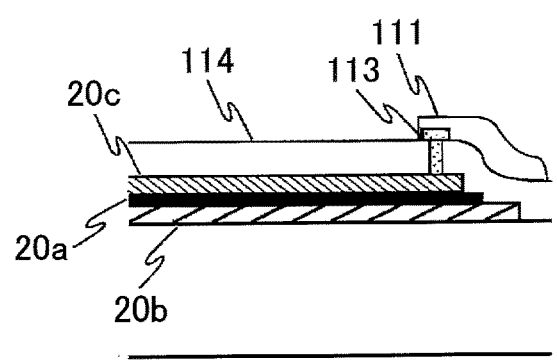
FIG. 9 is a cross-sectional view taken along a line C-C in FIG. 6 of the related art.

FIG. 9 is a cross-sectional view taken along a line C-C in FIG. 6.

In the sub-scanning piezoelectric elements 20 and 21, lower electrode layers 20b and 21b, piezoelectric layers 20a and 21a, and upper electrode layers 20c and 21c are deposited on the elastically deformable portions 12 and 13, and the periphery of this structure is covered with an insulating layer 114. In each of the sub-scanning piezoelectric elements 20 and 21 according the first embodiment, a ground signal line 112 to fall on the ground (grounded) is connected to the lower electrode layers 20b and 21b. On the other hand, a signal line 111 of the first sub-scanning driving signal Va is connected to the upper electrode layer 20c of the first sub-scanning piezoelectric element 20 through a contact hole 113 as a connection point provided in the insulating layer 114. On the other hand, a signal line 115 of the second sub-scanning driving signal Vb is connected to the upper electrode layer 21c of the second sub-scanning piezoelectric element 21 through a contact hole 116 as a connection point provided in the insulating layer 114.

The sub-scanning piezoelectric elements 20 and 21 are alternately arranged from the starting end to the terminal end of the elastically deformable member having the folded back structures, and therefore the signal line 111 of the first sub-scanning driving signal Va and the signal line 115 of the second sub-scanning driving signal Vb are wired so as to be connected in series between every other one of the sub-scanning piezoelectric elements 20 and 21. The signal lines 111 and 115 and the ground signal line 112 are wired so as to pass through mutually different positions on the elastically deformable member so as not to intersect each other for the purpose of creating these lines by the same wiring pattern creating step. Considering the viewpoints of the wiring efficiency and the simplification of manufacturing, for example, as illustrated in FIG. 6, the connection position of the signal line 111 of the first sub-scanning driving signal Va with respect to the first sub-scanning piezoelectric element 20 (the position of the contact hole 113 with respect to the sub-scanning piezoelectric element 20), and the connection position of the signal line 115 of the second sub-scanning driving signal Vb with respect to the second sub-scanning piezoelectric element 21 (the position of the contact hole 116 with respect to the second sub-scanning piezoelectric element 21) may not have a relationship that the positions are relatively the same or a relationship that the positions are symmetrical.

Specifically, in the example of the related art illustrated in FIG. 6, the position of the contact hole 113 is formed at a position close to one corner of the first sub-scanning piezoelectric element 20 (the rectangular upper electrode layer 20c), whereas the position of the contact hole 116 is formed at a position in the center in the lateral direction of the second sub-scanning piezoelectric element 21 (the rectangular upper electrode layer 21c). In general, when the connection positions of the signal lines with respect to the piezoelectric elements are different, even if the same driving voltage signal is applied, the potential distribution (electric field) generated in the piezoelectric element differs depending on the difference in the application point of the driving voltage signal, and the deformed state will also differ. Therefore, between the first sub-scanning piezoelectric element 20, whose connection position of the signal line is closer to one corner (one end in the lateral direction), and the second sub-scanning piezoelectric element 21, whose connection position of the signal line is in the center in the lateral direction, a difference will arise in the magnitude of the deforming force and the deforming direction for deforming the first elastically deformable portion 12 and the second elastically deformable portion 13, and non-uniformness arises in the curving and deforming state between the first elastically deformable portion 12 and the second elastically deformable portion 13. In this way, when non-uniformness arises in the curving and deforming state between the first elastically deformable portion 12 and the second elastically deformable portion 13, it becomes difficult to rotate the movable portion 17 in the sub-scanning direction by a desired rotation motion.

Figure 10:
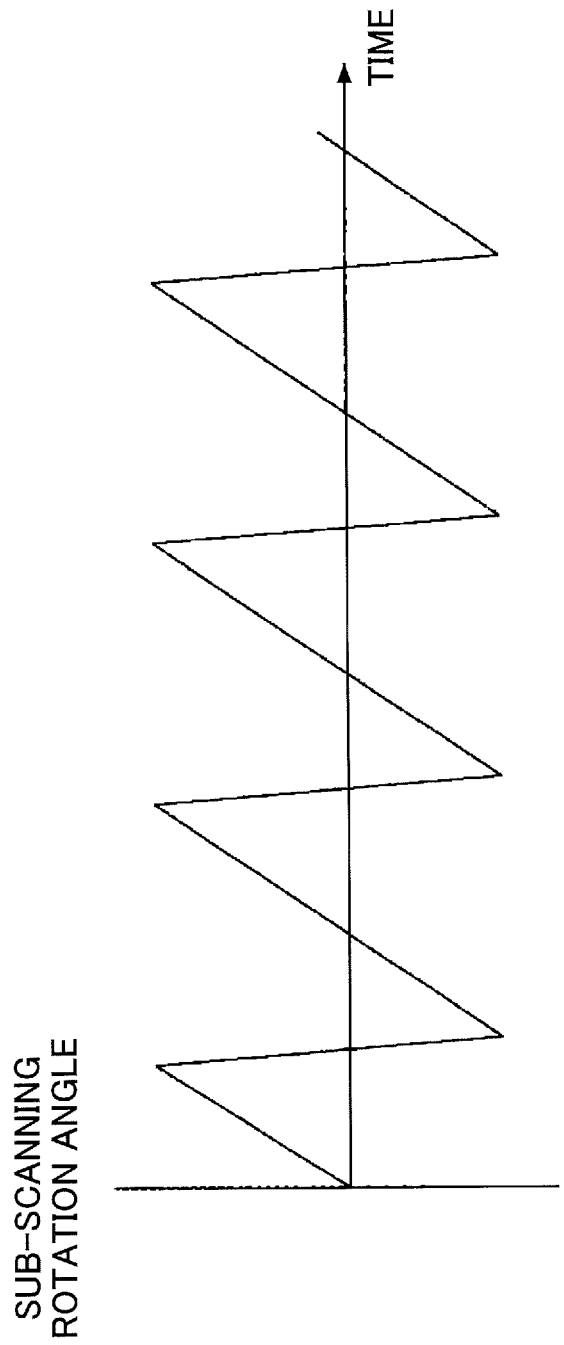
FIG. 10 is a graph illustrating an ideal change with time of a rotation angle in the sub-scanning direction according to the first embodiment of the present invention.
Figure 11:
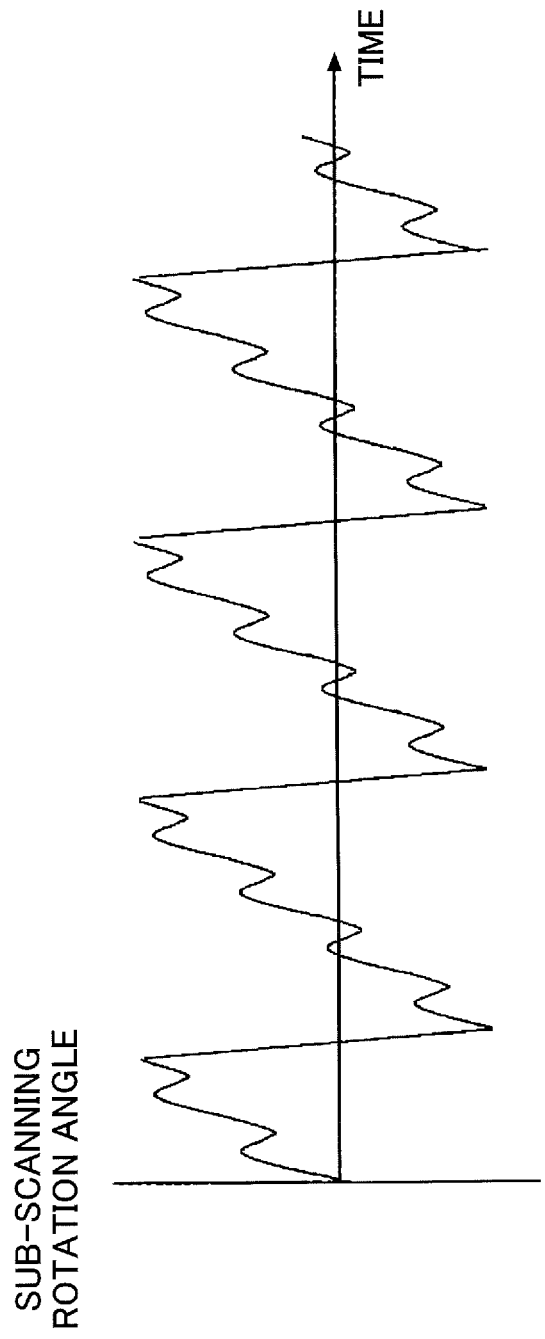
FIG. 11 is a graph illustrating an example in which an oscillation component of a resonance frequency is included in the change with time of a rotation angle in a sub-scanning direction according to the first embodiment of the present invention.
Figure 12:
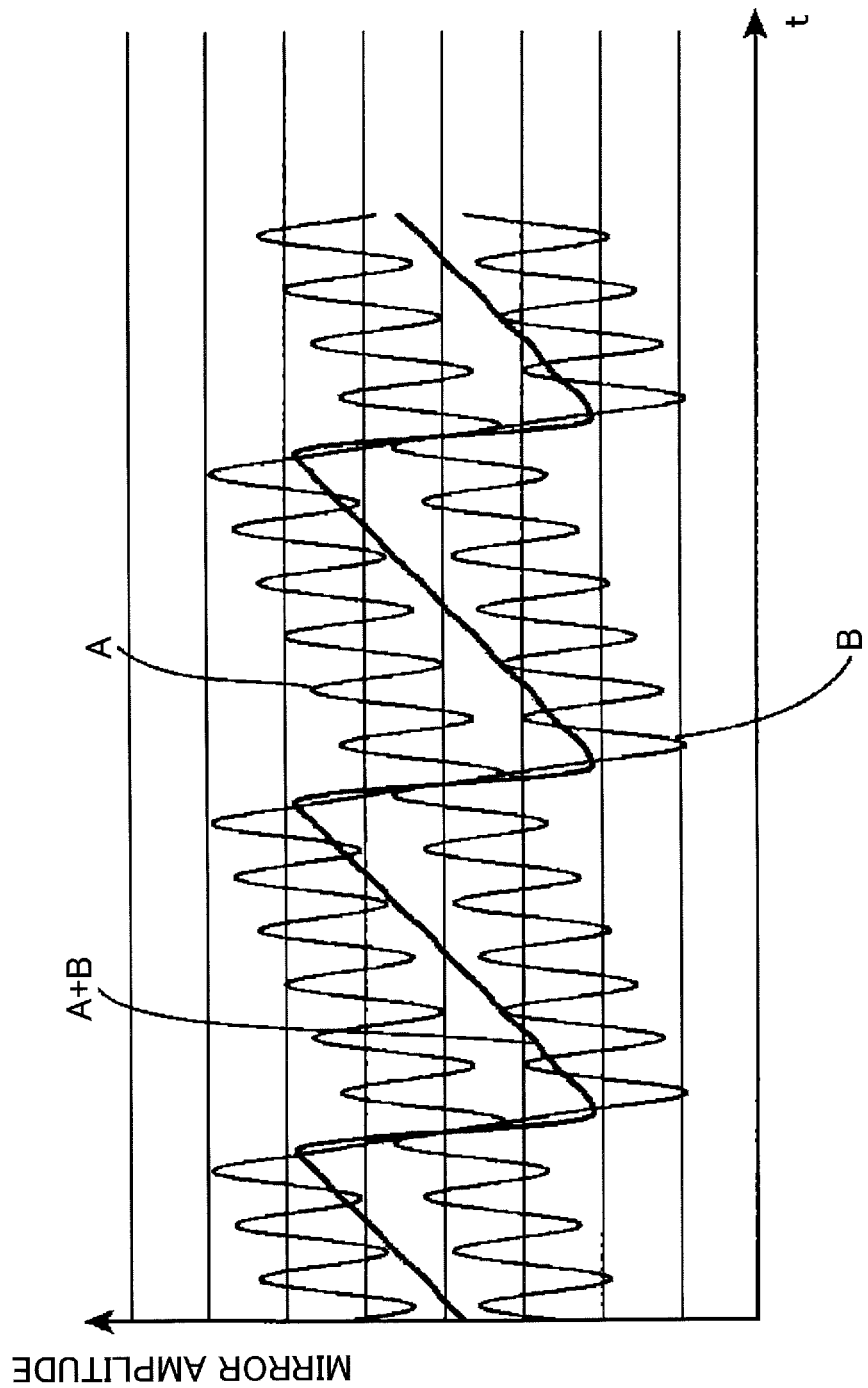
FIG. 12 is a graph illustrating an example in which the resonance frequency oscillation component during the deformation motion of the first elastically deformable portion and the resonance frequency oscillation component during the deformation motion of the second elastically deformable portion mutually cancel each other according to the first embodiment of the present invention.

In particular, the first embodiment has a unique resonance frequency according to the weight of the movable portion 17 and the rigidity of the support frame 11, etc. As illustrated in FIG. 10, ideally, it is desired that the rotation angle of the rotation motion of the movable portion 17 in the sub-scanning direction linearly changes with time, but in reality, as illustrated in FIG. 11, an oscillation component of the resonance frequency is applied, and it may be impossible to achieve a rotation motion in which the rotation angle in the sub-scanning direction linearly changes with time. Therefore, in the first embodiment, as illustrated in FIG. 12, the first sub-scanning driving signal Va applied to the first sub-scanning piezoelectric element 20 and the second sub-scanning driving signal Vb applied to the second sub-scanning piezoelectric element 21 are respectively set, such that a resonance frequency oscillation component (the waveform indicated by a symbol A in FIG. 12) during the deformation motion of the first elastically deformable portion 12, and a resonance frequency oscillation component (the waveform indicated by a symbol B in FIG. 12) during the deformation motion of the second elastically deformable portion 13, cancel out each other.

However, as described above, when non-uniformness has arisen in the curved and deformed state between the first elastically deformable portion 12 and the second elastically deformable portion 13, it becomes difficult to adjust the first sub-scanning driving signal Va and the second sub-scanning driving signal Vb such that a resonance frequency oscillation component (the waveform indicated by a symbol A in FIG. 12) during the deformation motion of the first elastically deformable portion 12, and a resonance frequency oscillation component (the waveform indicated by a symbol B in FIG. 12) during the deformation motion of the second elastically deformable portion 13, cancel out each other. Therefore, it is difficult to rotate the movable portion 17 in the sub-scanning direction by a desired rotation motion, due to the influence of the oscillation component of the resonance frequency.

Figure 13:
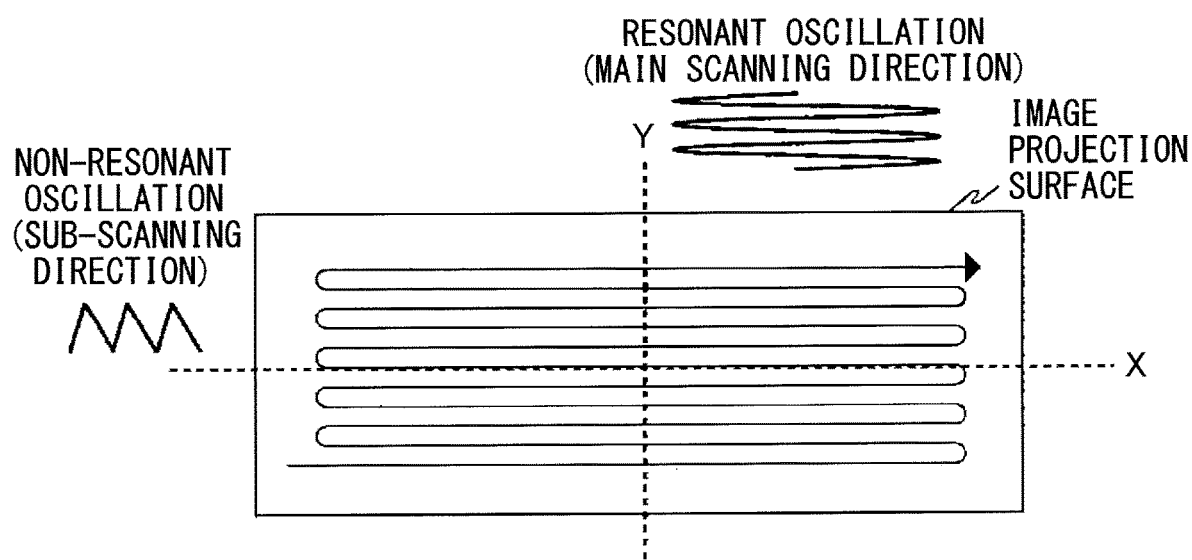
FIG. 13 is an explanatory diagram when an image is displayed by raster scanning according to the first embodiment of the present invention.
Figure 14:
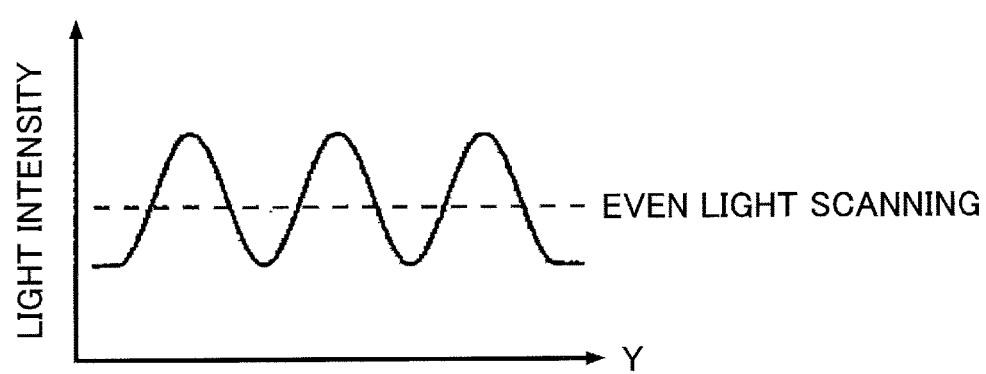
FIG. 14 is an explanatory diagram in which unevenness of an image occurs when the optical scanning speed of vertical scanning (sub-scanning) is non-uniform according to the first, embodiment of the present invention.

In the first embodiment, when displaying an image by two-dimensionally scanning (raster scanning) the projection light L incident on the mirror of the movable portion 17 as illustrated in FIG. 13, horizontal scanning (main scanning) corresponding to the X axis direction is implemented by a rotation motion using a mechanical resonance drive by the main scanning driving unit 31, and the vertical scanning (sub-scanning) corresponding to the Y axis direction is implemented by a non-resonant rotation motion by the sub-scanning driving units 32A and 32B. When the oscillation component of the resonance frequency is applied to this vertical scanning (sub-scanning), the rotation speed (scanning speed in the sub-scanning direction) of the movable portion 17 becomes non-uniform, and as illustrated in FIG. 14, on the displayed image, unevenness in the intensity of the projection light L in the vertical direction (Y axis direction), that is, image unevenness, will appear.

Figure 15:
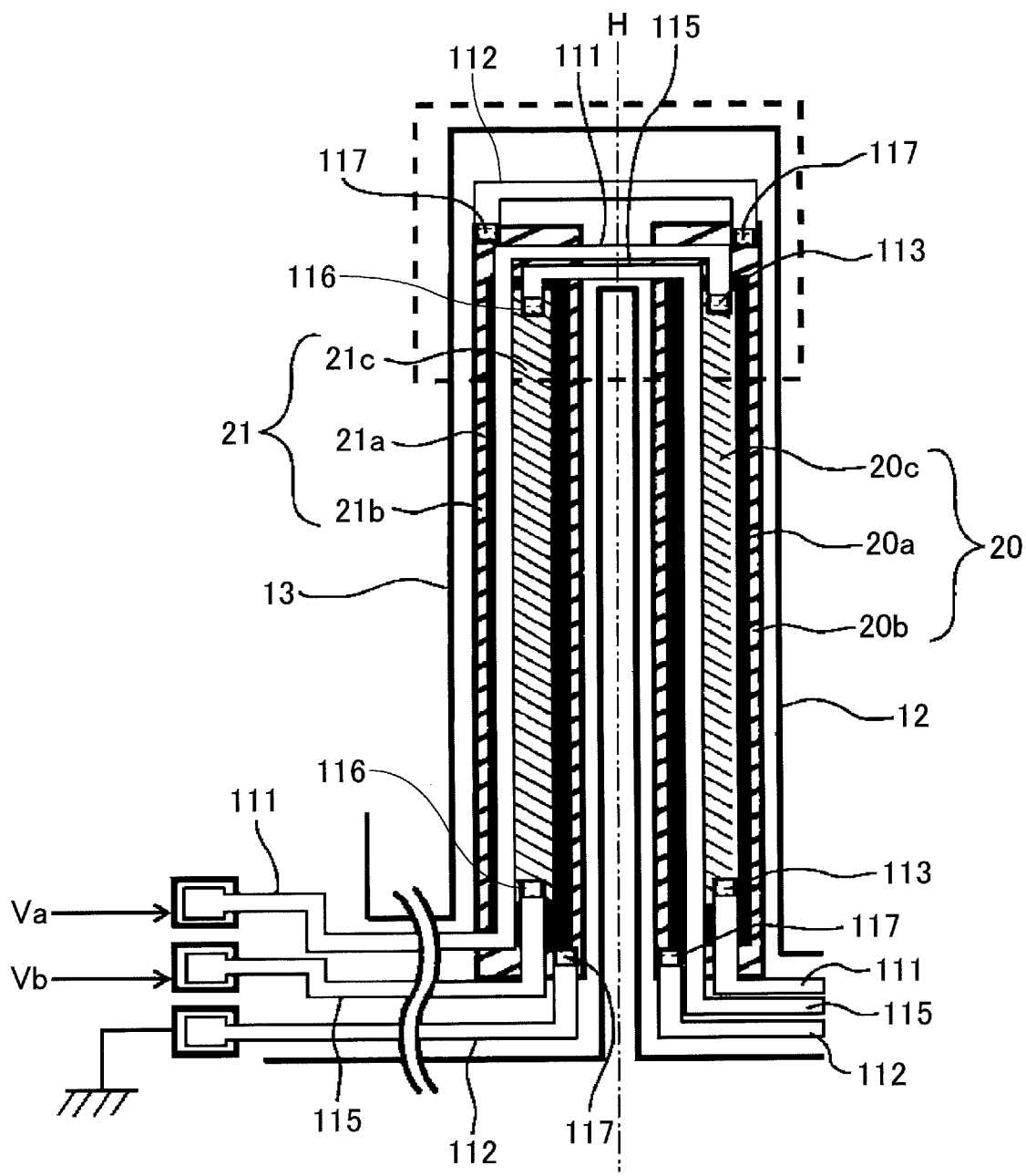
FIG. 15 is an explanatory diagram illustrating the wiring of the signal lines in the first elastically deformable portion, the second elastically deformable portion, and a folded back portion thereof in the first sub-scanning driving unit according to the first embodiment of the present invention.

FIG. 15 is an explanatory diagram illustrating the wiring of the signal lines in the first elastically deformable portion 12, the second elastically deformable portion 13, and a folded back portion thereof in the first sub-scanning driving unit 32A according to the first embodiment.

The first embodiment is configured such that the relationship between the connection position (the position of the contact hole 113) of the signal line 111 of the first driving voltage signal Va with respect to the first sub-scanning piezoelectric element 20 in the first sub-scanning piezoelectric element 20 and the connection position (the position of the contact hole 116) of the signal line 115 of the second driving voltage signal Vb with respect to the second sub-scanning piezoelectric element 21 in the sub-scanning piezoelectric element 21, is a relationship that the positions are relatively the same or a relationship that the positions are symmetrical across the all of the folded back structures.

More specifically, the position of the contact hole 113 is formed at a position close to one corner of the first sub-scanning piezoelectric element 20 (the rectangular upper electrode layer 20c), and the position of the contact hole 116 is also formed at a position close to one corner of the second sub-scanning piezoelectric element 21 (the rectangular upper electrode layer 21c). With such a configuration, it is possible to reduce the difference in the potential distribution (electric field) generated in the piezoelectric element, caused by the difference in the application points of the driving voltage signals Va and Vb between the first sub-scanning piezoelectric element 20 and the second sub-scanning piezoelectric element 21. As a result, it is easy to unify the deformed state between the first sub-scanning piezoelectric element 20 and the second sub-scanning piezoelectric element 21, and it is easy to unify the curved and deformed state between the first elastically deformable portion 12 and the second elastically deformable portion 13. Therefore, it is easy to rotate the movable portion 17 in the sub-scanning direction by a desired rotation motion.

Moreover, with such a configuration, it is easy to unify the deformed state between the first sub-scanning piezoelectric element 20 and the second sub-scanning piezoelectric element 21. As a result, it becomes easy to adjust the first sub-scanning driving signal Va and the second sub-scanning driving signal Vb such that a resonance frequency oscillation component (the waveform indicated by a symbol A in FIG. 12) during the deformation motion of the first elastically deformable portion 12, and a resonance frequency oscillation component (the waveform indicated by a symbol B in FIG. 12) during the deformation motion of the second elastically deformable portion 13, cancel out each other. Therefore, it is easy to reduce the influence of the oscillation component of the resonance frequency during the rotation motion in the sub-scanning direction and to rotate the movable portion 17 in the sub-scanning direction by a desired rotation motion.

As in the first embodiment, in order to achieve a relationship between the connection position (the position of the contact hole 113) of the signal line 111 of the first driving voltage signal Va with respect to the first sub-scanning piezoelectric element 20 in the first sub-scanning piezoelectric element 20 and the connection position (the position of the contact hole 116) of the signal line 115 of the second driving voltage signal Vb with respect to the second sub-scanning piezoelectric element 21 in the sub-scanning piezoelectric element 21, to be a relationship that the positions are relatively the same or a relationship that the positions are symmetrical, it is preferable that the signal lines (the ground signal line 112 in the first embodiment) connected to the lower electrode layers 20b and 21b are wired so as to always pass through the outer periphery side of all of the folded back portions, than the other signal lines 111 and 115. As in the configurations of the piezoelectric elements 20 and 21 according to the first embodiment, in which the lower electrode layers 20b and 21b, the piezoelectric layers 20a and 21a, and the upper electrode layers 20c and 21c are deposited on the elastically deformable portions 12 and 13, generally, the lower electrode layers 20b and 21b have portions extending on an outer side than the upper electrode layers 20c and 21c, and the ground signal line 112 is connected to the extended portions. Therefore, the connection position (the position of a contact hole 117) of the ground signal line 112 connected to the lower electrode layers 20b and 21b is easier to locate on the outer edge side of the piezoelectric elements 20 and 21, than the connection positions (the positions of the contact holes 113 and 116) of the signal lines 111 and 115 connected to the upper electrode layers 20c and 21c. If the ground signal line 112 connected to the lower electrode layers 20b and 21b is wired so as to always pass through the outer peripheral side of the folded back portion, the wiring positions of the signal lines 111 and 115 connected to the upper electrode layers 20c and 21c can be determined without being obstructed by the ground signal line 112. Therefore, it is easy to wire the signal lines such that the relationship between the connection position (the position of the contact hole 113) of the signal line 111 of the first driving voltage signal Va with respect to the first sub-scanning piezoelectric element 20 in the first sub-scanning piezoelectric element 20 and the connection position (the position of the contact hole 116) of the signal line 115 of the second driving voltage signal Vb with respect to the second sub-scanning piezoelectric element 21 in the sub-scanning piezoelectric element 21, is a relationship that the positions are relatively the same or a relationship that the positions are symmetrical.

Furthermore, in the first embodiment, the first elastically deformable portion 12 and the second elastically deformable portion 13 have substantially the same shape and size in the first sub-scanning driving unit 32A, such that non-uniformness does not easily arise in the curved and deformed state between the first elastically deformable portion 12 and the second elastically deformable portion 13. Accordingly, the identity or symmetry of the curved and deformed state between the first elastically deformable portion 12 and the second elastically deformable portion 13 can be further achieved.

Furthermore, in the first embodiment, in the first sub-scanning driving unit 32A, the first sub-scanning piezoelectric element 20 and the second sub-scanning piezoelectric element 21 have substantially the same shape and size and are respectively formed at substantially the same positions with respect to the first elastically deformable portion 12 and the second elastically deformable portion 13, in order to make it difficult for non-uniformness to arise in the curved and deformed state between the first elastically deformable portion 12 and the second elastically deformable portion 13. Accordingly, the identity or symmetry of the curved and deformed state between the first elastically deformable portion 12 and the second elastically deformable portion 13 can be further achieved.

Figure 16:
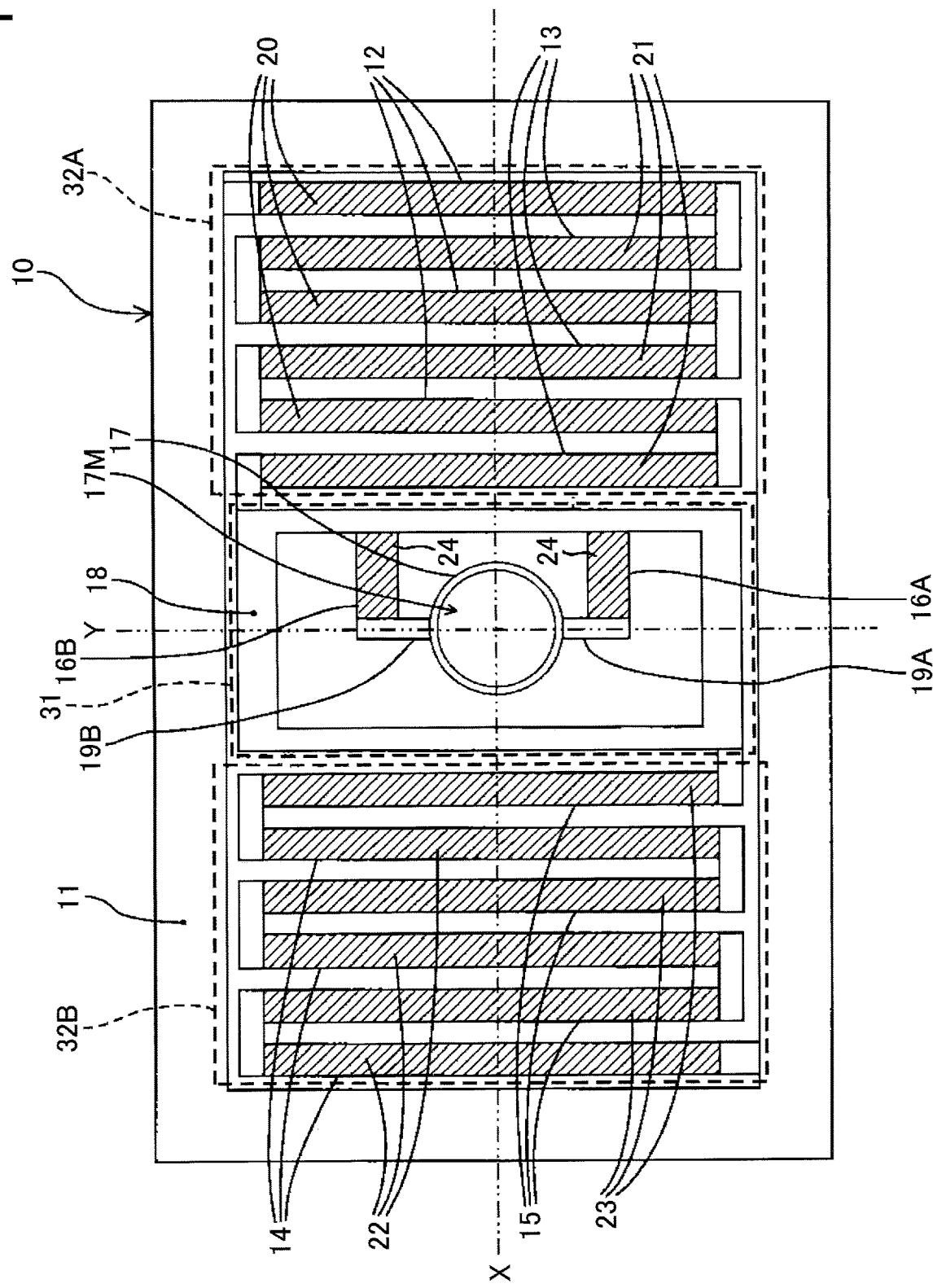
FIG. 16 is a plan view illustrating a modified example the actuator driving device in which one end of a fifth elastically deformable portion is cantilevered by a movable portion frame according to the first embodiment of the present invention.

Note that in the actuator driving device according to the first embodiment, both ends of each of the fifth elastically deformable portions 16A and 16B, which are holding the torsion bars 19A and 19B connected to the movable portion 17, are supported by the movable portion frame 18, thereby forming a both end supporting configuration; however, as illustrated in FIG. 16, one end of each of the fifth elastically deformable portions 16A and 16B may be supported by the movable portion frame 18, thereby forming cantilevered configuration. Furthermore, the relationship between the connection positions (the positions of the contact holes 113 and 117) of the signal lines 111 and 112 of the first driving voltage signal Va with respect to the first sub-scanning piezoelectric element 20, and the connection positions (the positions of the contact holes 116 and 117) of the signal lines 115 and 112 of the second driving voltage signal Vb with respect to the second sub-scanning piezoelectric element 21, are preferably a relationship that the positions are relatively the same or a relationship that the positions are symmetrical at both the upper electrode and the lower electrode; however, the relationship between the connection positions may be a relationship that the positions are relatively the same or a relationship that the positions are symmetrical only at the electrode on the voltage applying side, among the voltage applying side electrode (the upper electrode in the embodiment) and a common potential side electrode (the lower electrode in the embodiment). This is because the effect of the first embodiment can be obtained even in the case where the above-described relationship of the connection positions is achieved only on the voltage applying side. The reason for this is considered to be that the electrode on the voltage applying side has a large contribution to the potential distribution generated in the piezoelectric element. Note that the electrode on the voltage applying side may be the lower electrode and the electrode having a common potential may be the upper electrode.

Figure 22:
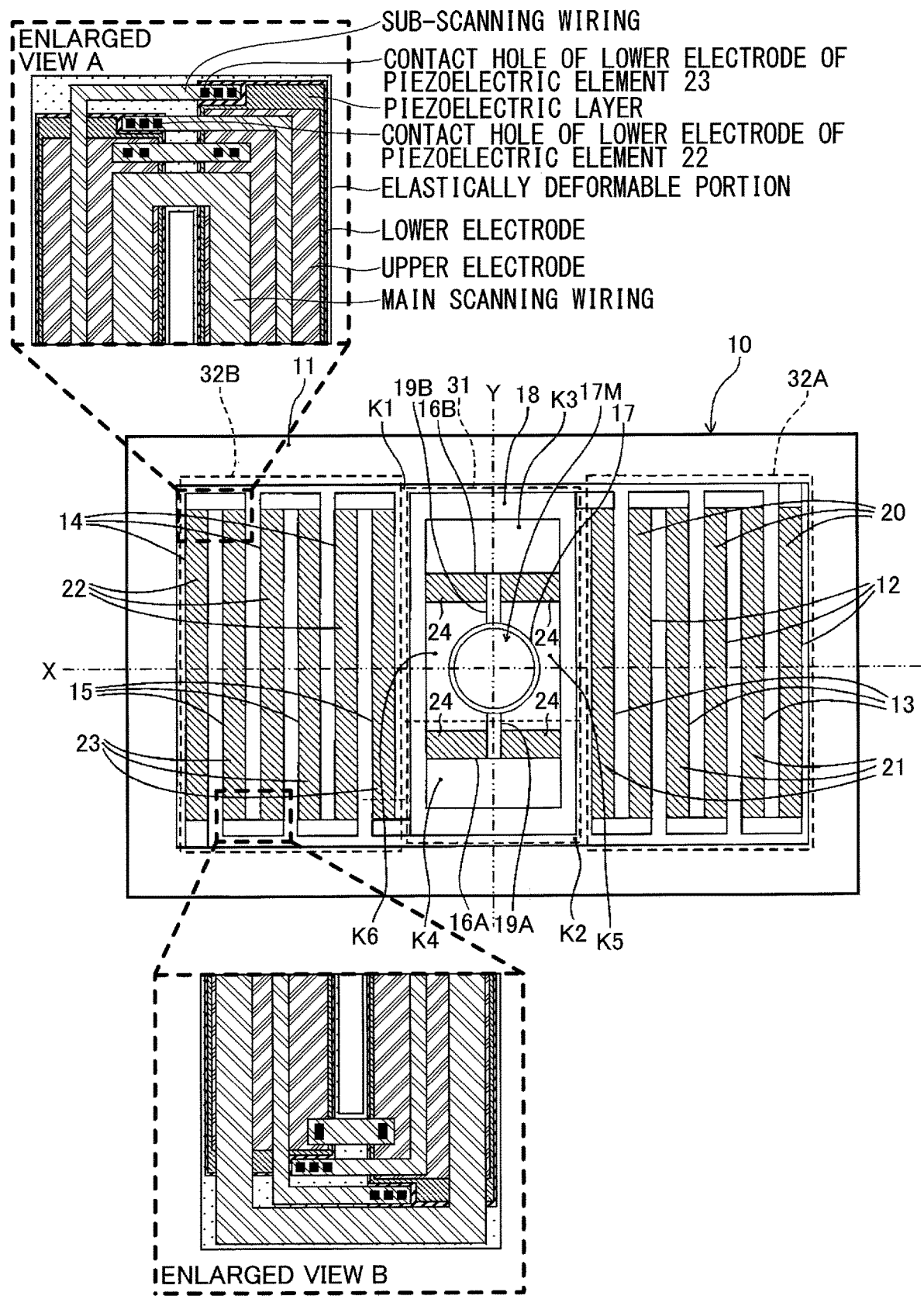
FIG. 22 is a diagram illustrating connection positions of electrodes in a piezoelectric element according to the first embodiment of the present invention.

Furthermore, as illustrated in FIG. 22, the lower electrode may be configured to be an electrode on the voltage applying side, and the upper electrode may be configured to be an electrode on the common potential side, and furthermore, the first piezoelectric element and the second piezoelectric element may be arranged at different positions with respect to the folded back portion. In FIG. 22, the upper electrodes have a common potential (common ground), and therefore the upper electrodes are connected by adjacent piezoelectric elements, and each of the lower electrodes is connected to a lower electrode of a piezoelectric element next to the adjacent piezoelectric element. The insulating film is omitted. Referring to the enlarged view A of FIG. 22, at the folded back portion, the position where the third sub-scanning piezoelectric element 22 that is the first piezoelectric element is provided, is closer to the outer periphery side of the folded back portion, than the position where the fourth sub-scanning piezoelectric element 23 that is the second piezoelectric element is provided. In this case, the lower electrode that is the electrode on the voltage applying side is arranged such that the connection position with a signal line of the lower electrode of the first piezoelectric element in the third sub-scanning piezoelectric element 22 that is the first piezoelectric element, and the connection position with a signal line of the lower electrode of a second piezoelectric element in the fourth sub-scanning piezoelectric element 23 that is the second piezoelectric element, are relatively the same or symmetrical. For example, referring to the enlarged view A and the enlarged view B of FIG. 22, the position of the contact hole of the lower electrode of the third sub-scanning piezoelectric element 22 and the position of the contact hole of the fourth sub-scanning piezoelectric element 23 are located so as to be in point symmetry with respect to the center point of the contact hole. Furthermore, referring to the enlarged view C of FIG. 23, the outermost and innermost wirings are the lower electrode wirings, the middle wiring is the upper electrode wiring, and the two wirings between the upper electrode wiring and the lower electrode wiring are the main scanning wirings. In the enlarged view C, each of the positions of the contact holes of the lower electrodes in the piezoelectric elements are at the upper left corner of each piezoelectric element, and have a relationship that the positions are relatively the same.

Figure 23:
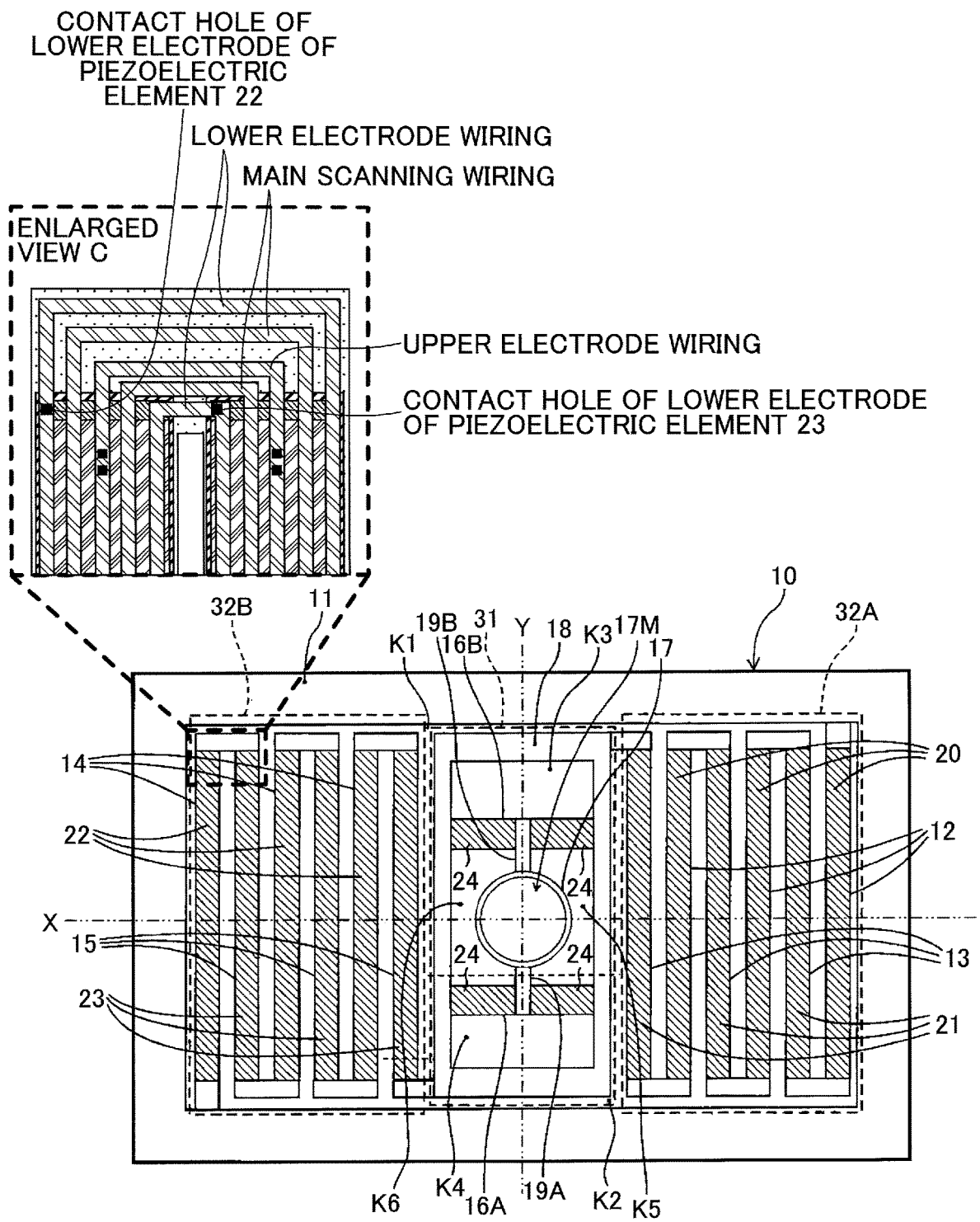
FIG. 23 is a diagram illustrating connection positions of electrodes in a piezoelectric element according to the first embodiment of the present invention.

Furthermore, the upper electrode serving as the electrode on the common potential side, the lower electrode to which the first driving voltage signal is applied, and the lower electrode to which the second driving voltage signal is applied, may be electrically connected in parallel. For example, as illustrated in FIG. 23, each signal line is wired so as to be a single line that does not intersect with each other when viewed from the front side of the page, from the piezoelectric element at the starting end to the piezoelectric element at the terminal end in the sub-scanning driving unit, and the single line is connected to a plurality of electrodes via a contact hole, and therefore the electrodes can be wired so as to be electrically connected in parallel. This makes it possible to reduce the voltage drop that slightly occurs between the piezoelectric elements near the starting end and the piezoelectric elements near the terminal end in the sub-scanning driving unit as a result of electrically connecting the electrodes in parallel. Therefore, it is possible to avoid a difference in the movements of the piezoelectric elements depending on the location where the contact hole is arranged, and to stably drive the rotating apparatus.

Note that in the above-described embodiment, it is not necessary to maintain the relationship of the above connection positions with the signal lines with respect to all piezoelectric elements in the sub-scanning driving units 32A and 32B. That is, as illustrated in FIG. 23, at least one of the starting end and the terminal end of the sub-scanning driving unit is to have the relationship of the above connection positions with the signal lines.

Figure 24:
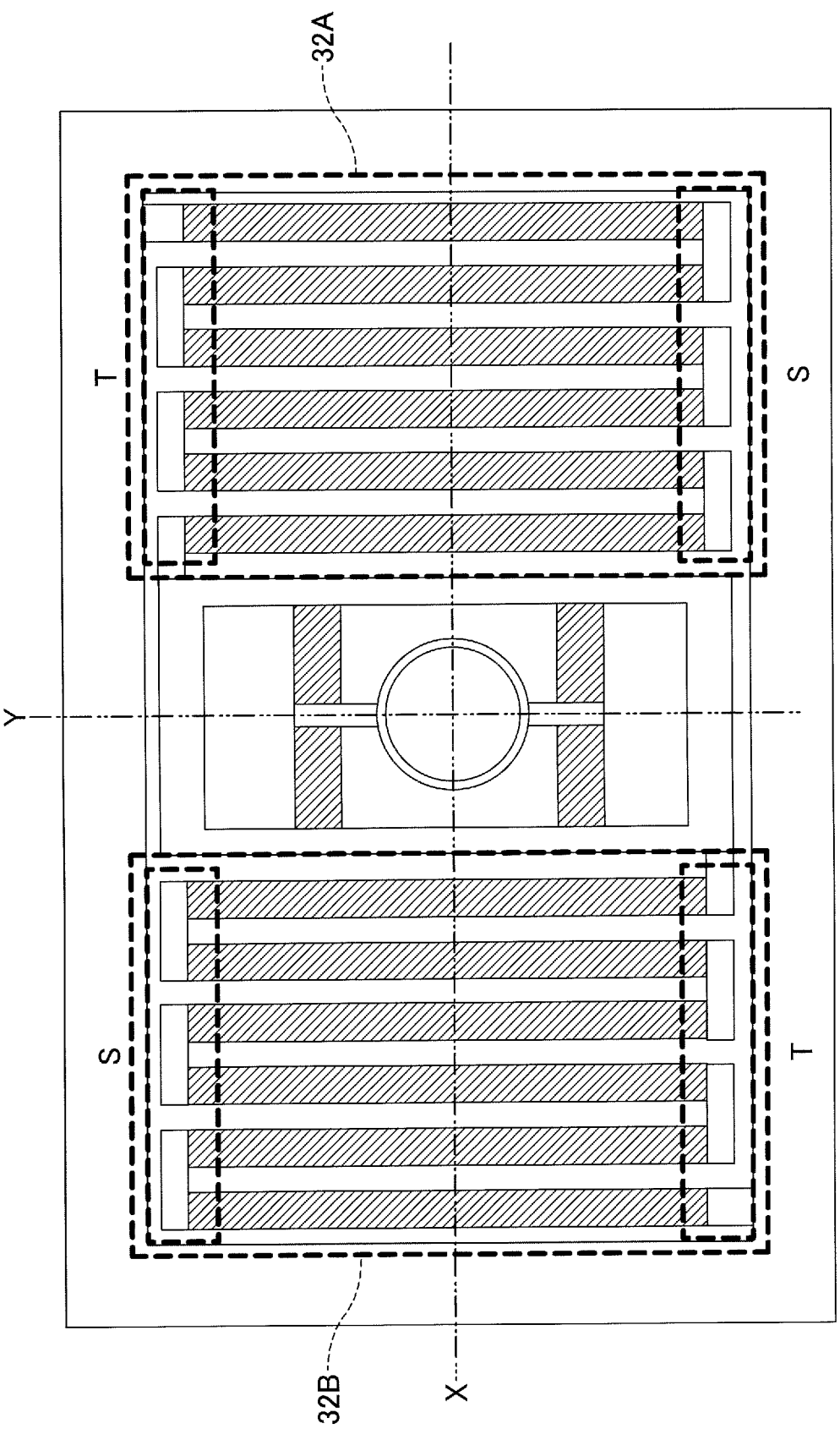
FIG. 24 is a diagram illustrating connection positions of signal lines and piezoelectric elements in a sub-scanning driving unit according to the first embodiment of the present invention.
Figure 25:
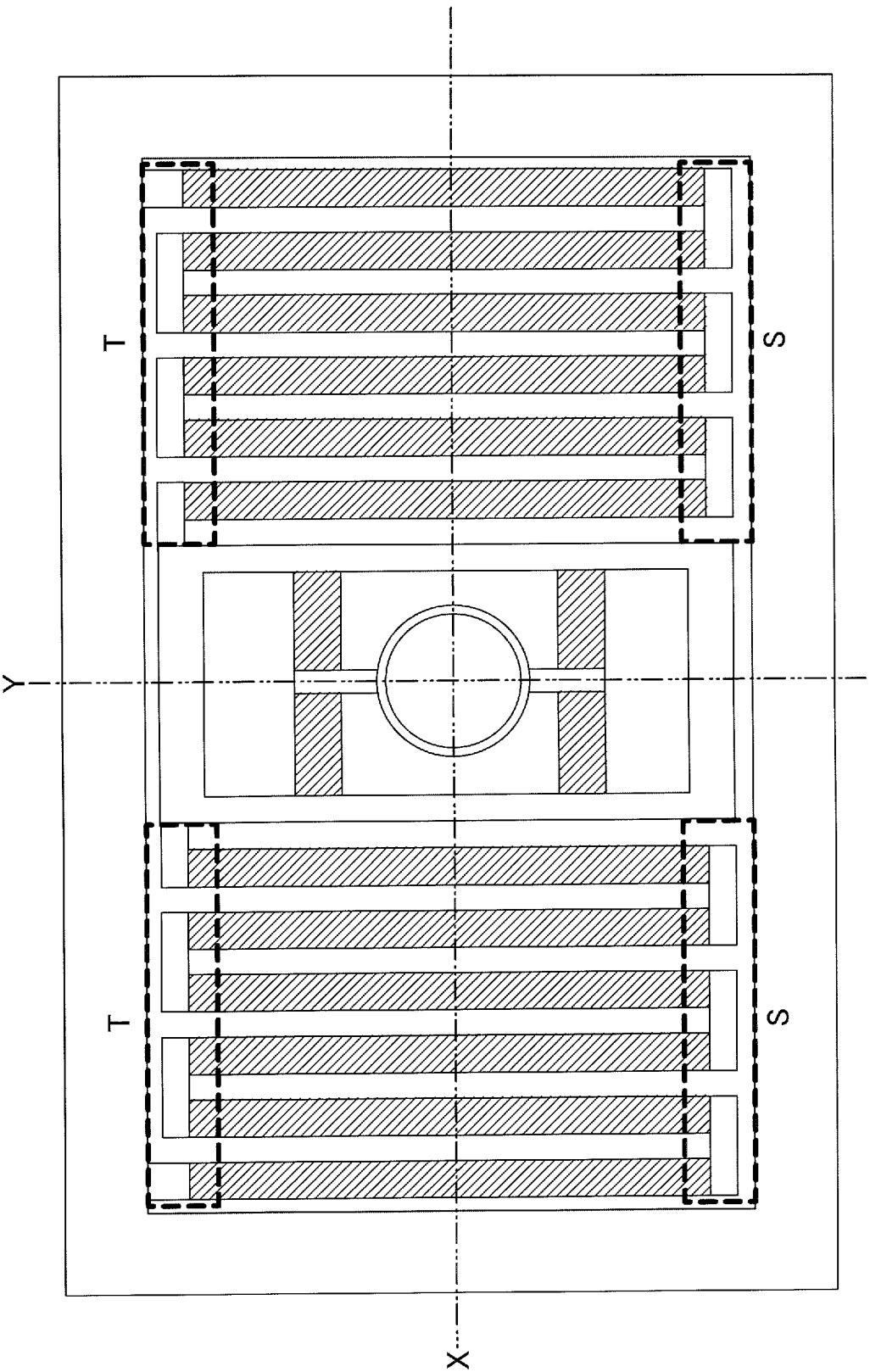
FIG. 25 is a diagram illustrating connection positions of signal lines and piezoelectric elements in a sub-scanning driving unit according to the first embodiment of the present invention.

Furthermore, when the connection positions at the starting end or the terminal end of the sub-scanning driving unit are asymmetrical with respect to the center line in the Y direction of the sub-scanning driving unit, as illustrated in FIG. 24, it is preferable that the connection positions with the signal lines in the sub-scanning driving unit 32A and the sub-scanning driving unit 32B are point symmetrical with respect to the movable portion. That is, as illustrated in FIG. 24, in the case where the connection positions of the signal lines and the piezoelectric elements in an S region and a T region in the sub-scanning driving unit 32A and the sub-scanning driving unit 32B are asymmetrical with respect to the center line in the Y direction, the connection positions of the signal lines and the piezoelectric elements are provided so as to be point symmetrical with respect to the movable portion, in the S region and the T region in the sub-scanning driving unit 32A and the sub-scanning driving unit 32B. Note that in FIG. 24, the connecting portions of the support frame and the sub-scanning driving units are point symmetric with respect to the movable portion, and therefore compared to a case where the connecting portions are line symmetrical with respect to the center line in the Y direction (see FIG. 25), the weight balance and the electric balance between the sub-scanning driving units 32A and 32B are improved, and unnecessary oscillations will hardly occur.

The relationship of the connection positions of the signal lines being the same between the first sub-scanning piezoelectric element 20 and the second sub-scanning piezoelectric element 21, means a state that around at least at one of the folded back portions, the position (for example, the position of the contact hole) where the signal line is connected to the electrode for voltage application in the first sub-scanning piezoelectric element 20, and the position where the signal line is connected to the electrode for voltage application in the second sub-scanning piezoelectric element 21, are relatively the same. Furthermore, the relationship of the connection positions of the signal lines being symmetrical between the first sub-scanning piezoelectric element 20 and the second sub-scanning piezoelectric element 21, means a state that around at least at one of the folded back portions, the position (for example, the position of the contact hole) where the signal line is connected to the electrode for voltage application in the first sub-scanning piezoelectric element 20, and the position where the signal line is connected to the electrode for voltage application in the second sub-scanning piezoelectric element 21, are line symmetrical with respect to a center line H (see FIG. 15) of the folded back portion, or point symmetrical with respect to the center point of the contact hole as illustrated in FIG. 22.

Figure 17:
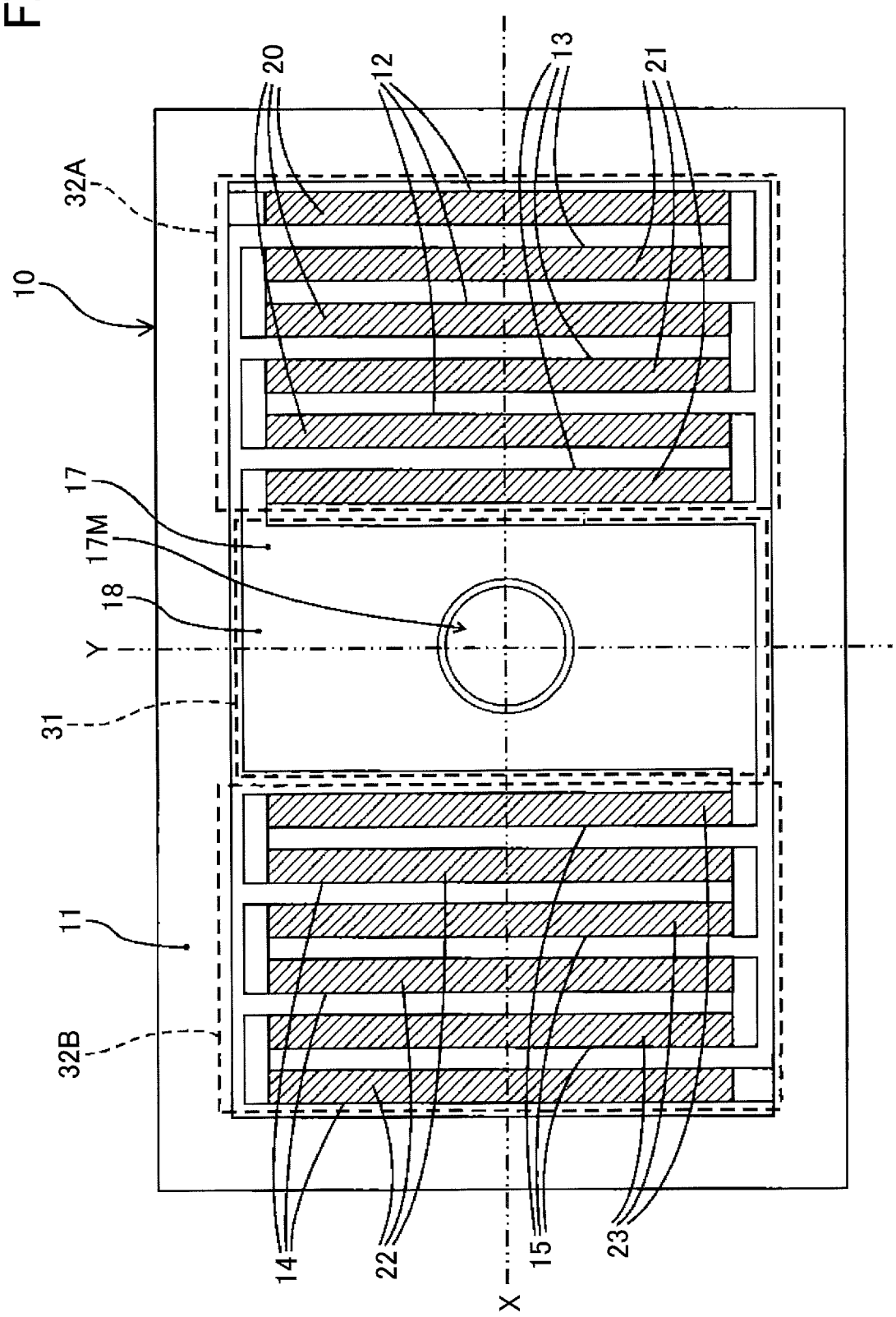
FIG. 17 is a plan view illustrating a modified example the actuator driving device for one-dimensional scanning according to the first embodiment of the present invention.

Furthermore, the actuator driving device according to the first embodiment not only rotates the movable portion 17 in the sub-scanning direction by the sub-scanning driving units 32A and 32B, but also rotates the movable portion 17 in the main scanning direction by the main scanning driving unit 31, thereby performing two-dimensional scanning. However, as illustrated in FIG. 17, it is not necessary to provide the main scanning driving unit 31, and the actuator driving device may rotate the movable portion 17 only in the sub-scanning direction by the sub-scanning driving units 32A and 32B, thereby performing one-dimensional scanning.

Furthermore, in the first embodiment, the actuator driving device is used as an optical scanning apparatus that scans light by reciprocally rotating the mirror 17M that reflects incident light coming from one direction; however, the actuator driving device is not limited as such, for example, the actuator driving device may also be used as a light receiving device for guiding light to a light receiving unit arranged at a specific position by rotating the mirror 17M that reflects incident light coming from a plurality of directions.

Furthermore, the apparatus to which the actuator driving device according to the first embodiment can be applied, is not limited to the optical scanning apparatus.

Furthermore, in the above-described first embodiment, the HUD device is cited as an example of the image forming apparatus adopting the optical scanning apparatus to which the actuator driving device according to the first embodiment is applied. However, the actuator driving device may similarly be applied to a head mount display used by being attached to the observer's head, or an image projection device such as a projector for displaying an image by projecting an image on a screen, etc.

Second Embodiment

Next, an embodiment in which the rotating apparatus according to the present invention is applied to an optical scanning apparatus of an optical writing unit 610 in an image forming apparatus such as a printer or a copying machine (hereinafter, the present embodiment will be referred to as a "second embodiment") will be described.

Figure 18:
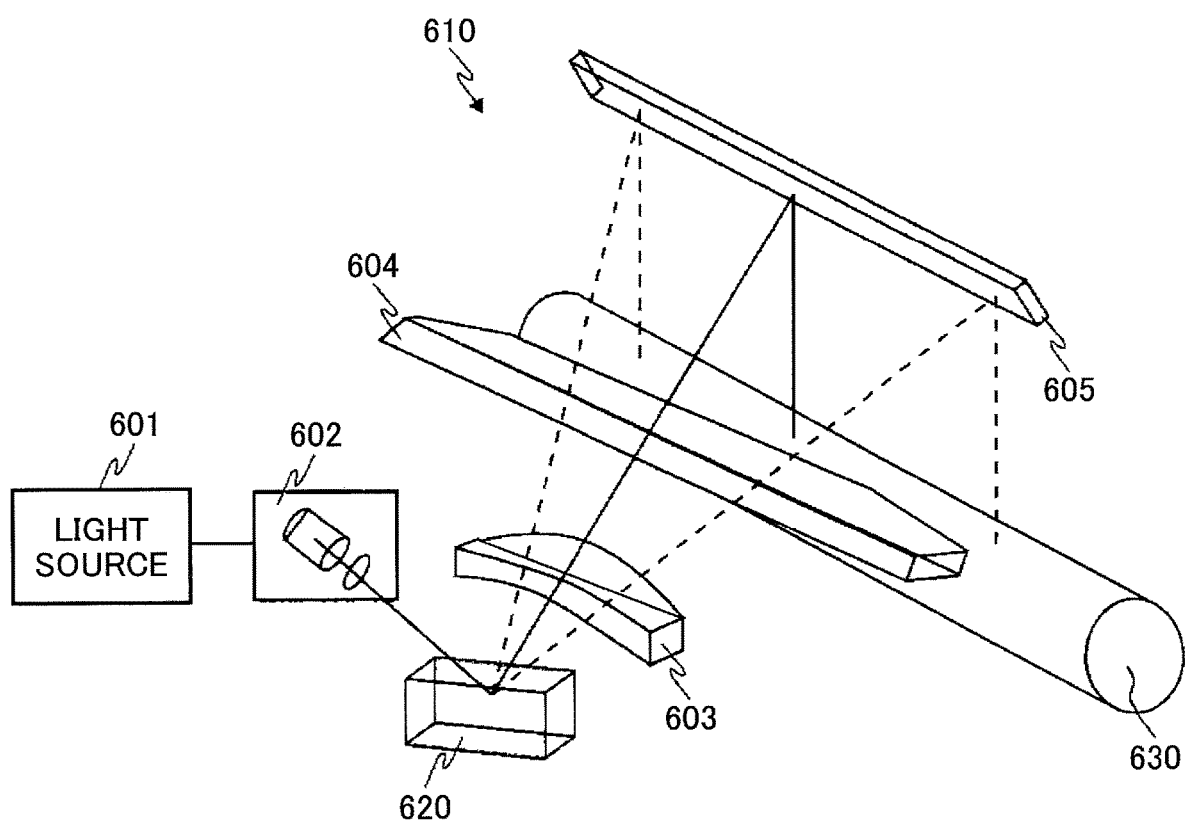
FIG. 18 is a configuration diagram illustrating an example of an optical writing unit of an image forming apparatus according to a second embodiment of the present invention.

FIG. 18 is a configuration diagram illustrating an example of the optical writing unit 610 of an image forming apparatus according to the second embodiment.

In the optical writing unit 610 according to the second embodiment, a laser beam from a light source unit 601 such as a laser element, etc., is deflected by an optical scanning apparatus 620 via an image forming optical system 602 such as a collimator lens. As the actuator driving device of the optical scanning apparatus 620, the actuator driving device used in the optical scanning apparatus 208 of the above-described first embodiment is used. However, in the second embodiment, as long as one-dimensional optical scanning can be implemented, as illustrated in FIG. 17, the main scanning driving unit 31 may not be provided, and an actuator driving device that performs one-dimensional scanning by only rotating the movable portion 17 in the sub-scanning direction by the sub-scanning driving units 32A and 32B will suffice. The laser beam deflected by the optical scanning apparatus 620 subsequently passes through a first lens 603, a second lens 604, and a reflection mirror portion 605 and irradiates the surface of a photoconductive drum 630 that is the surface to be scanned. Accordingly, a light beam is focused on the surface of the photoconductive drum 630 in a spot shape.

Figure 19:
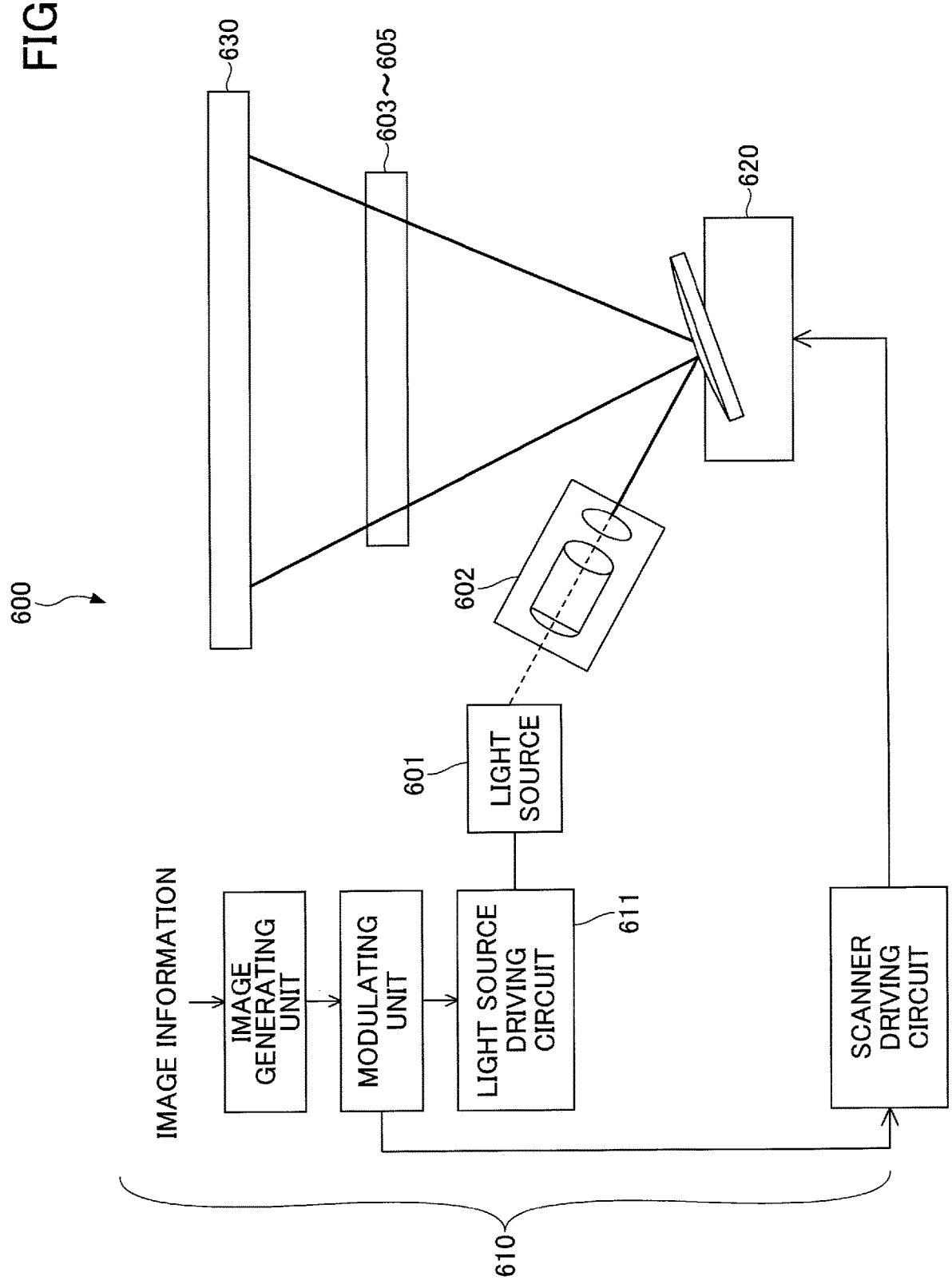
FIG. 19 is an explanatory diagram illustrating an example of the image forming apparatus according to the second embodiment of the present invention.

FIG. 19 is an explanatory diagram illustrating an example of an image forming apparatus 600 according to the second embodiment.

In the image forming apparatus 600 according to the second embodiment, the photoconductive drum 630 is an image bearer that provides a surface to be scanned as an optical scanning target of the optical writing unit 610. The optical writing unit 610 scans the surface of the photoconductive drum 630 as the surface to be scanned in the axial direction of the photoconductive drum 630, with one or a plurality of laser beams modulated by recording signals. When the photoconductive drum 630 is rotationally driven, the surface of the photoconductive drum 630 is charged by a charging means and is then optically scanned by the optical writing unit 610, whereby an electrostatic latent image is formed. The electrostatic latent image is developed into a toner image by a developing means, and the toner image is transferred to a recording sheet by a transferring means. The transferred toner image is fixed on the recording sheet by a fixing means. The residual toner is removed, by the cleaning unit, from the surface portion of the photoconductive drum 630 that has passed through the transferring means. Instead of the photoconductive drum 630, a belt-shaped photoconductive member may be used. Furthermore, it is also possible to adopt an intermediate transfer method in which a toner image is first transferred onto an intermediate transfer member, and then a toner image is transferred from the intermediate transfer member to a recording sheet.

Note that when the optical scanning apparatus 620 is configured to be capable of two-dimensional scanning, the present invention can also be applied to an image forming apparatus such as a laser labeling device that prints by two-dimensionally scanning a laser beam on a thermal medium and heating the thermal medium.

Third Embodiment

Next, an embodiment (hereinafter, the present embodiment will be referred to as a "third embodiment") in which the rotating apparatus according to the present invention is applied to an optical deflector in a laser scanning type object recognition apparatus, will be described.

The object recognition apparatus according to the third embodiment uses the optical deflector to optically scan an area where the recognition target object exists, and receives the reflected light from the recognition target object existing in the area, so as to recognize the recognition target object.

Figure 20:
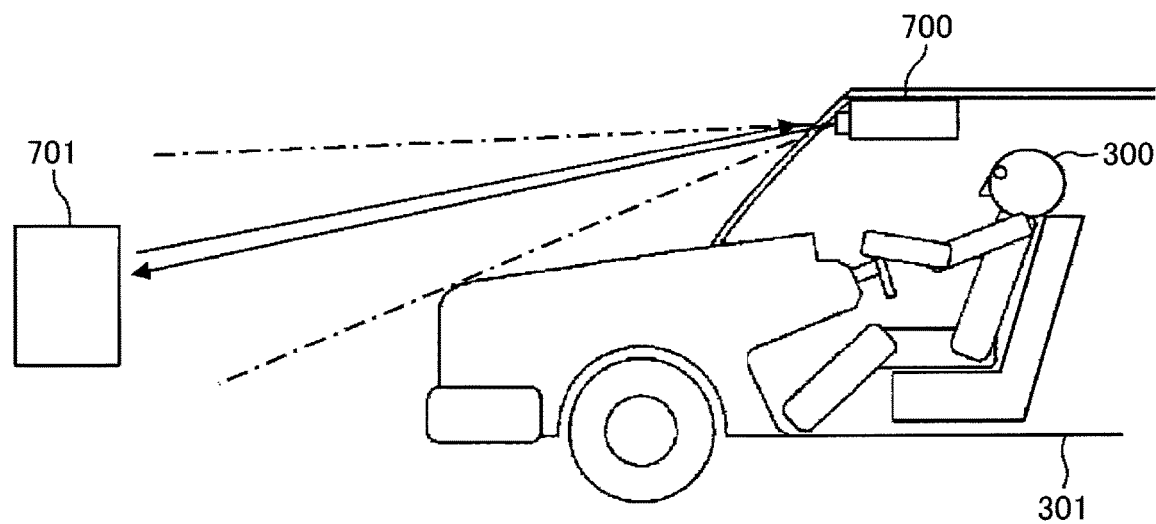
FIG. 20 is an explanatory diagram illustrating the outline of an object recognition apparatus according to a third embodiment of the present invention.

FIG. 20 is an explanatory diagram illustrating the outline of the object recognition apparatus according to the third embodiment.

Figure 21:
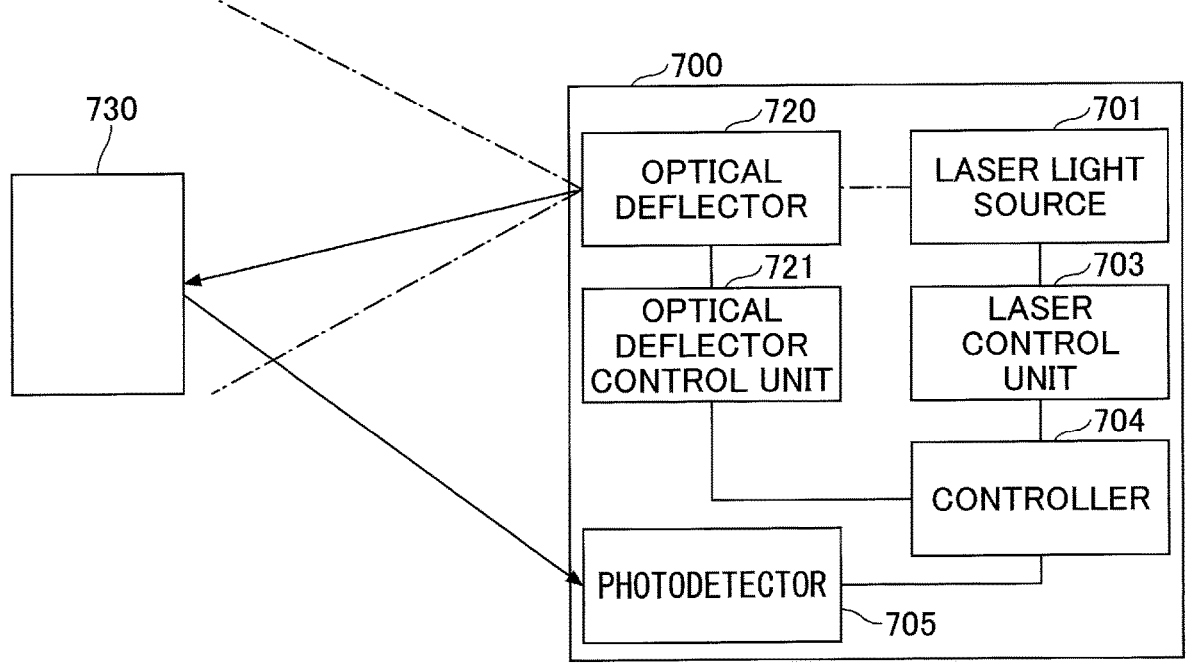
FIG. 21 is a block diagram illustrating the main part of the object recognition apparatus according to the third embodiment of the present invention.

FIG. 21 is a block diagram illustrating the main part of the object recognition apparatus according to the third embodiment.

An object recognition apparatus 700 according to the third embodiment is installed in the interior of the automobile 301, for example, and can monitor the front of the vehicle to recognize whether there is an obstacle (recognition target object 730) in the forward direction. A laser beam emitted from a laser light source 701 passes through an optical system such as a collimator lens, and is scanned by one-dimensional scanning or two-dimensional scanning by an optical deflector 720, and irradiates the front area of the vehicle. A photodetector 705 receives the laser beam that has been reflected by the recognition target object 730 and that has passed through an optical system such as a condenser lens, and outputs a detection signal. The laser light source 701 is controlled by a laser control unit 703, and the optical deflector 720 is controlled by an optical deflector control unit 721.

A controller 704 controls the laser control unit 703 and the optical deflector control unit 721, to process the detection signal output from the photodetector 705. Specifically, the controller 704 calculates the distance to the recognition target object 730 by a difference between the timing of emitting the laser beam and the timing of receiving the laser beam by the photodetector 705. By scanning the laser beam with the optical deflector 720, the distance to the recognition target object 730 in the area over the one-dimensional or two-dimensional range is obtained. Furthermore, the object recognition apparatus 700 may be configured to recognize the material and the shape, etc., of the recognition target object 730 based on the light intensity of the reflected light received by the photodetector 705, and the change in wavelength due to reflection, etc.

Although the object recognition apparatus according to the third embodiment is for recognizing an obstacle ahead of the vehicle, the present invention is not limited as such. For example, it is possible to similarly apply the object recognition apparatus to a biometric authentication device for authenticating a target person by recording and referring to information obtained by optically scanning a hand or a face, a security sensor for recognizing an intruder by performing optical scanning with respect to a predetermined monitor area, and a three-dimensional scanner for recognizing the shape of an object from distance information obtained by optical scanning and outputting the shape as three-dimensional data.

The above descriptions are examples, and specific effects are attained by each of the following aspects.

Aspect A

A rotating apparatus such as an actuator driving device includes a folded back elastically deformable portion such as the sub-scanning driving units 32A and 32B in which a folded back structure is repeatedly formed a plurality of times, the folded back structure being formed by connecting a terminal end of a first elastically deformable portion such as the first elastically deformable portion 12 and the third elastically deformable portion 14 to a starting end of a second elastically deformable portion such as the second elastically deformable portion 13 and the fourth elastically deformable portion 15 connected at a folded back portion; a supporting portion such as the support frame 11 configured to support a starting end side of the folded back elastically deformable portion; the movable portion 17 attached to a terminal end side of the folded back elastically deformable portion; a first piezoelectric element such as the first sub-scanning piezoelectric element 20 and the third sub-scanning piezoelectric element 22 configured to curve and deform the first elastically deformable portion; a second piezoelectric element such as the second sub-scanning piezoelectric element 21 and the fourth sub-scanning piezoelectric element 23 configured to curve and deform the second elastically deformable portion; and a piezoelectric element driver such as the control unit 250 configured to rotate the movable portion around a predetermined rotation axis such as an X axis, by respectively applying a first driving voltage signal Va and a second driving voltage signal Vb that are different from each other to the first piezoelectric element and the second piezoelectric element, to curve and deform the first elastically deformable portion and the second elastically deformable portion, wherein a connection position (the position of the contact hole 113) and a connection position (the position of the contact hole 116) have a relationship of being relatively the same positions or a relationship of being symmetrical positions across all of the folded back structures, the connection position (the position of the contact hole 113) being a position where the signal line 111 of the first driving voltage signal Va and the first piezoelectric element are connected, and the connection position (the position of the contact hole 116) being a position where the signal line 115 of the second driving voltage signal Vb and the second piezoelectric element are connected.

In this aspect, the first driving voltage signal line is connected to the first piezoelectric element provided at the first elastically deformable portion of the folded back elastically deformable portion, and the first driving voltage signal is applied from the first driving voltage signal line. Similarly, the second driving voltage signal line is connected to the second piezoelectric element provided at the second elastically deformable portion of the folded back elastically deformable portion, and the second driving voltage signal, which is different from the first driving voltage signal, is applied from the second driving voltage signal line. In this way, when different driving voltage signals are respectively applied to different portions, namely the first elastically deformable portion and the second elastically deformable portion, so as to curve and deform the first elastically deformable portion and the second elastically deformable portion, the amount of displacement of the movable portion is increased by accumulating the deformation so that it is possible to secure a wide range of rotation of the movable portion; however, the curved and deformed state tends to be non-uniform between the first elastically deformable portion and the second elastically deformable portion, and it is difficult to rotate the movable portion by a desired rotation motion.

In the related art, for example, the shape of the first elastically deformable portion and the shape of the second elastically deformed portion are made to be identical with high precision, or the shape of the first piezoelectric element and the shape of the second piezoelectric element are made to be identical with high precision, in order to prevent the curved and deformed state to be non-uniform between the first elastically deformable portion and the second elastically deformable portion; however, non-uniformness still arises in the curved and deformed state between the first elastically deformable portion and the second elastically deformable portion. The inventors of the present invention found that one of the factors of the non-uniformness of the curved and deformed state that still arises, is that the relationship of the connection positions of the signal lines with respect to the piezoelectric elements between the first piezoelectric element and the second piezoelectric element, is not a relationship that the positions are relatively the same or a relationship that the positions are symmetrical.

More specifically, on the first elastically deformed portion, the second elastically deformed portion, and the folded back portion of the folded back elastically deformable portion, signal lines of a first driving voltage signal and a second driving voltage signal for respectively driving the first piezoelectric element and the second piezoelectric element, are wired. The first piezoelectric element and the second piezoelectric element are respectively provided at the first elastically deformable portion and the second elastically deformable portion alternately positioned from the starting end to the terminal end of the elastically deformable member having the folded back structure, and therefore the signal line for the first driving voltage signal and the signal line for the second driving voltage signal are respectively wired so as to be connected to every other one of the piezoelectric elements including the first piezoelectric element and the second piezoelectric element.

In consideration of wiring efficiency and simplification of manufacturing, etc., generally, these signal lines are wired so as not to intersect each other on the first elastically deformable portion, the second elastically deformable portion, and the folded back portion. In order to realize such wiring, the connection position on the first piezoelectric element to which the first driving voltage signal line is connected and the connection position on the second piezoelectric element to which the second driving voltage signal line is connected, may not have a relationship that the positions are the same or a relationship that the positions are symmetrical with respect to the respective piezoelectric elements, in some cases. In general, when the connection positions of the signal lines with respect to the piezoelectric elements are different, even if the same driving voltage signal is applied, the potential distribution (electric field) generated in the piezoelectric element differs depending on the difference in the application point of the driving voltage signal, and the deformed state of the piezoelectric elements will also differ. Therefore, between the first piezoelectric element and the second piezoelectric element, when the connection positions of the signal lines to the piezoelectric elements do not have a relationship that the positions are relatively the same or a relationship that the positions are symmetrical, a difference will arise in the magnitude of the deforming force and the deforming direction for deforming the first elastically deformable portion and the second elastically deformable portion, between the first piezoelectric element and the second piezoelectric element, and non-uniformness arises in the curving and deforming state between the first elastically deformable portion and the second elastically deformable portion.

Therefore, the present embodiment is configured such that the relationship between the connection position of the signal line of the first driving voltage signal with respect to the first piezoelectric element and the connection position of the signal line of the second driving voltage signal with respect to the second piezoelectric element, is a relationship that the positions are relatively the same or a relationship that the positions are symmetrical across the all of the folded back structures. With such a configuration, it is possible to reduce the difference in the potential distribution (electric field) generated in the piezoelectric element, caused by the difference in the application points of the driving voltage signals between the first piezoelectric element and the second piezoelectric element, and it becomes easy to unify the deformed state between the first piezoelectric element and the second piezoelectric element. As a result, it becomes easy to unify the curved and deformed state between the first elastically deformable portion and the second elastically deformable portion.

Aspect B

In aspect A, the first piezoelectric element and the second piezoelectric element are configured such that the lower electrode layers 20b and 21b, the piezoelectric layers 20a and 21a, and the upper electrode layers 20c and 21c are respectively deposited on the elastically deformable member, wherein one of a lower electrode wiring such as the ground signal line 112 connected to the lower electrode layer or an upper electrode wiring such as the signal lines 111 and 115 connected to the upper electrode layer is the signal line of the first driving voltage signal Va or the second driving voltage signal Vb, and the other one is a ground line, and at each folded back portion of the elastically deformable member, the lower electrode wiring is positioned on an outer periphery side of the folded back portion than the upper electrode wiring.

Accordingly, the relationship between the connection position of the first driving voltage signal line to the first piezoelectric element and the connection position of the second driving voltage signal line to the second piezoelectric element, can be easily made to be a relationship that the positions are relatively the same or a relationship that the positions are symmetrical, across all of the folded back structures.

Aspect C

In aspect B, at each folded back portion of the elastically deformable member, a connection position (the position of the contact hole 117) of the lower electrode wiring with respect to the first piezoelectric element and the second piezoelectric element, is positioned on an outer periphery side of the folded back portion, than a connection position of the upper electrode wiring with respect to the first piezoelectric element and the second piezoelectric element.

Accordingly, the relationship between the connection position of the first driving voltage signal line to the first piezoelectric element and the connection position of the second driving voltage signal line to the second piezoelectric element, can be easily made to be a relationship that the positions are relatively the same or a relationship that the positions are symmetrical, across all of the folded back structures.

Aspect D

In aspect B or C, the first piezoelectric element and the second piezoelectric element have a rectangular shape, and the lower electrode wiring and the upper electrode wiring are each connected to the first piezoelectric element and the second piezoelectric element, at a position close to a corner of the first piezoelectric element and the second piezoelectric element.

Accordingly, the relationship between the connection position of the first driving voltage signal line to the first piezoelectric element and the connection position of the second driving voltage signal line to the second piezoelectric element, can be easily made to be a relationship that the positions are relatively the same or a relationship that the positions are symmetrical, across all of the folded back structures.

Aspect E

In any one of aspects A to D, the first piezoelectric element and the second piezoelectric element have the same shape, and are respectively provided at the first elastically deformable portion and the second elastically deformable portion at relatively the same position.

Accordingly, it is easier to unify the curved and deformed state between the first elastically deformable portion and the second elastically deformable portion.

Aspect F

In any one of aspects A to E, the first elastically deformable portion and the second elastically deformable portion have the same shape across all of the folded back structures.

Accordingly, it is easier to unify the curved and deformed state between the first elastically deformable portion and the second elastically deformable portion.

Aspect G

Any one of aspects A to F further includes a movable portion rotator configured to repeatedly rotate the movable portion around a second rotation axis that is substantially orthogonal to the predetermined rotation axis.

Accordingly, it is possible to rotate the movable portion in a two-dimensional direction, and a two-dimensional optical scanning apparatus, etc., can be implemented.

Aspect H

An optical scanning apparatus such as the optical scanning apparatus 208, 620, and the optical deflector 720 includes a scanner configured to scan light that is output from a light outputter such as the light source unit 230, wherein the scanner uses the rotating apparatus according to any one aspects A to G to scan the light with a light reflection surface of an optical member such as the mirror 17M provided in the movable portion 17 of the rotating apparatus.

Accordingly, it is possible to implement an optical scanning apparatus capable of performing a desired optical scanning operation.

Aspect I

An image display apparatus such as the automotive HUD device 200 includes an image scanning light outputter configured to output image scanning light based on image information; and a scanner configured to two-dimensionally scan the image scanning light output from the image scanning light outputter, wherein the scanner uses the rotating apparatus according to aspect G to scan the image scanning light with a light reflection surface of an optical member provided in the movable portion of the rotating apparatus, and the scanner repeatedly rotates the movable portion around the predetermined rotation axis to scan the image scanning light in one direction among an image horizontal direction and an image vertical direction, and the scanner repeatedly rotates the movable portion around the second rotation axis to scan the image scanning light in the other direction among the image horizontal direction and the image vertical direction.

Accordingly, it is possible to display a high-quality image with less image unevenness.

According to an embodiment of the present invention, it is possible to achieve the effects of making it easy to unify the deformation between the first elastically deformable portion and the second elastically deformable portion, and making it possible to rotate the movable portion by a desired rotation motion.

The rotating apparatus, the optical scanning apparatus, and the image display apparatus are not limited to the specific embodiments described in the detailed description, and variations and modifications may be made without departing from the spirit and scope of the present invention.

What is claimed is:
1. A rotating apparatus comprising:
a folded back elastically deformable portion including one or more first elastically deformable portions and one or more second elastically deformable portions, wherein a folded back structure is repeatedly formed one or more times, the folded back structure being formed by con- necting a terminal end of a leading first elastically deformable portion of the one or more first elastically deformable portions to a starting end of a leading second elastically deformable portion of the one or more second elastically deformable portions at a leading folded back portion and connecting a terminal end of the leading second elastically deformable portion to a starting end of a next first elastically deformable portion of the one or more first elastically deformable portions at a next folded back portion;

a supporting portion configured to support a starting end side of the folded back elastically deformable portion;

a movable portion attached to a terminal end side of the folded back elastically deformable portion;

a first piezoelectric element provided at the one or more first elastically deformable portions to deform the one or more first elastically deformable portions;

a second piezoelectric element provided at the one or more second elastically deformable portions to deform the one or more second elastically deformable portions;

a piezoelectric element driver configured to rotate the movable portion around a predetermined rotation axis, by respectively applying a first driving voltage and a second driving voltage that are different from each other to the first piezoelectric element and the second piezoelectric element, to deform the one or more first elastically deformable portions and the one or more second elastically deformable portions;

a first signal line configured to connect the first piezoelectric element to the piezoelectric element driver; and a second signal line configured to connect the second piezoelectric element to the piezoelectric element driver, wherein the first piezoelectric element includes a first voltage applying electrode, a first piezoelectric layer, and a common potential electrode, and is configured such that a first lower electrode layer corresponding to the first voltage applying electrode or the common potential electrode, the first piezoelectric layer, and a first upper electrode layer corresponding to the common potential electrode or the first voltage applying electrode, are deposited on the one or more first elastically deformable portions, the second piezoelectric element includes a second voltage applying electrode, a second piezoelectric layer, and the common potential electrode, and is configured such that a second lower electrode layer corresponding to the second voltage applying electrode or the common potential electrode, the second piezoelectric layer, and a second upper electrode layer corresponding to the common potential electrode or the second voltage applying electrode, are deposited on the one or more second elastically deformable portions, one of a first lower electrode wiring connected to the first lower electrode layer or a first upper electrode wiring connected to the first upper electrode layer is the first signal line configured to apply the first driving voltage, and the other of the first lower electrode wiring or the first upper electrode wiring is a ground line, one of a second lower electrode wiring connected to the second lower electrode layer or a second upper electrode wiring connected to the second upper electrode layer is the second signal line configured to apply the second driving voltage, and the other of the second lower electrode wiring or the second upper electrode wiring is the ground line, and a first connection position and a second connection position have a relationship of being relatively the same positions or a relationship of being symmetrical positions, the first connection position being a position where the first signal line and the first voltage applying electrode of the first piezoelectric element are connected in the first piezoelectric element, and the second connection position being a position where the second signal line and the second voltage applying electrode of the second piezoelectric element are connected in the second piezoelectric element.

2. The rotating apparatus according to claim 1, wherein at each folded back portion of the folded back elastically deformable portion, the first lower electrode wiring and the second lower electrode wiring are positioned on an outer periphery side of the folded back portion than the first upper electrode wiring and the second upper electrode wiring.

3. The rotating apparatus according to claim 2, wherein at each folded back portion of the folded back elastically deformable portion, a connection position of the first lower electrode wiring with respect to the first piezoelectric element and a connection position of the second lower electrode wiring with respect to the second piezoelectric element, are positioned on an outer periphery side of the folded back portion, than a connection position of the first upper electrode wiring with respect to the first piezoelectric element and a connection position of the second upper electrode wiring with respect to the second piezoelectric element.

4. The rotating apparatus according to claim 2, wherein the first piezoelectric element and the second piezoelectric element have a rectangular shape, and the first lower electrode wiring and the first upper electrode wiring are each connected to the first piezoelectric element and the second lower electrode wiring and the second upper electrode wiring are each connected to the second piezoelectric element, at a position close to a corner of the first piezoelectric element or the second piezoelectric element.

5. The rotating apparatus according to claim 1, wherein the first piezoelectric element and the second piezoelectric element have the same shape, and are respectively provided at the one or more first elastically deformable portions and the one or more second elastically deformable portions at relatively the same position.

6. The rotating apparatus according to claim 1, wherein the one or more first elastically deformable portions and the one or more second elastically deformable portions have the same shape across all of the folded back structures.

7. The rotating apparatus according to claim 1, further comprising:

a movable portion rotator configured to repeatedly rotate the movable portion around a second rotation axis that is substantially orthogonal to the predetermined rotation axis.

8. An optical scanning apparatus comprising:

a scanner configured to scan light that is output from a light outputter, wherein the scanner uses the rotating apparatus according to claim 1 to scan the light with a light reflection surface of an optical member provided in the movable portion of the rotating apparatus.

9. An image display apparatus comprising:
an image scanning light outputter configured to output image scanning light based on image information; and
a scanner configured to two-dimensionally scan the image scanning light output from the image scanning light outputter, wherein
the scanner uses the rotating apparatus according to claim 7 to scan the image scanning light with a light reflection surface of an optical member provided in the movable portion of the rotating apparatus, and
the scanner repeatedly rotates the movable portion around the predetermined rotation axis to scan the image scanning light in one direction among an image horizontal direction and an image vertical direction, and the scanner repeatedly rotates the movable portion around the second rotation axis to scan the image scanning light in another direction among the image horizontal direction and the image vertical direction.

10. The rotating apparatus according to claim 1, wherein in a case where the first connection position and the second connection position have the relationship of being symmetrical positions, the positions are point symmetrical or line symmetrical positions.

\* \* \* \* \*